US008501633B2

(12) United States Patent
Lee

(10) Patent No.: US 8,501,633 B2
(45) Date of Patent: Aug. 6, 2013

(54) FORMING SUBSTRATE STRUCTURE BY FILLING RECESSES WITH DEPOSITION MATERIAL

(75) Inventor: Sang In Lee, Sunnyvale, CA (US)

(73) Assignee: Synos Technology, Inc., Fremont, CA (US)

( * ) Notice: Subject to any disclaimer, the term of this patent is extended or adjusted under 35 U.S.C. 154(b) by 0 days.

(21) Appl. No.: 13/572,555

(22) Filed: Aug. 10, 2012

(65) Prior Publication Data

US 2012/0302071 A1    Nov. 29, 2012

Related U.S. Application Data

(63) Continuation of application No. 12/539,289, filed on Aug. 11, 2009, now Pat. No. 8,263,502.

(60) Provisional application No. 61/088,679, filed on Aug. 13, 2008.

(51) Int. Cl.
*H01L 21/31*    (2006.01)

(52) U.S. Cl.
USPC .......... 438/761; 438/424; 438/435; 438/437; 438/758; 438/778; 257/E21.24

(58) Field of Classification Search
USPC ............ 438/431, 778, 435, 437; 257/E21.24
See application file for complete search history.

(56) References Cited

U.S. PATENT DOCUMENTS

| | | | | |
|---|---|---|---|---|
| 6,103,595 | A * | 8/2000 | Jeng | 438/431 |
| 6,150,238 | A * | 11/2000 | Wu et al. | 438/435 |
| 2006/0046427 | A1 * | 3/2006 | Ingle et al. | 438/424 |
| 2007/0048954 | A1 * | 3/2007 | Kato et al. | 438/308 |
| 2007/0269982 | A1 * | 11/2007 | Rocklein et al. | 438/680 |

* cited by examiner

*Primary Examiner* — Angel Roman
(74) *Attorney, Agent, or Firm* — Fenwick & West LLP

(57) ABSTRACT

A substrate structure is produced by forming a first material layer on a substrate having a recess, removing the first material layer from the portion of the substrate except for the recess using a second material that reacts with the first material, and forming a deposition film from the first material layer using a third material that reacts with the first material. A method of manufacturing a device may include the method of forming a substrate structure.

13 Claims, 25 Drawing Sheets

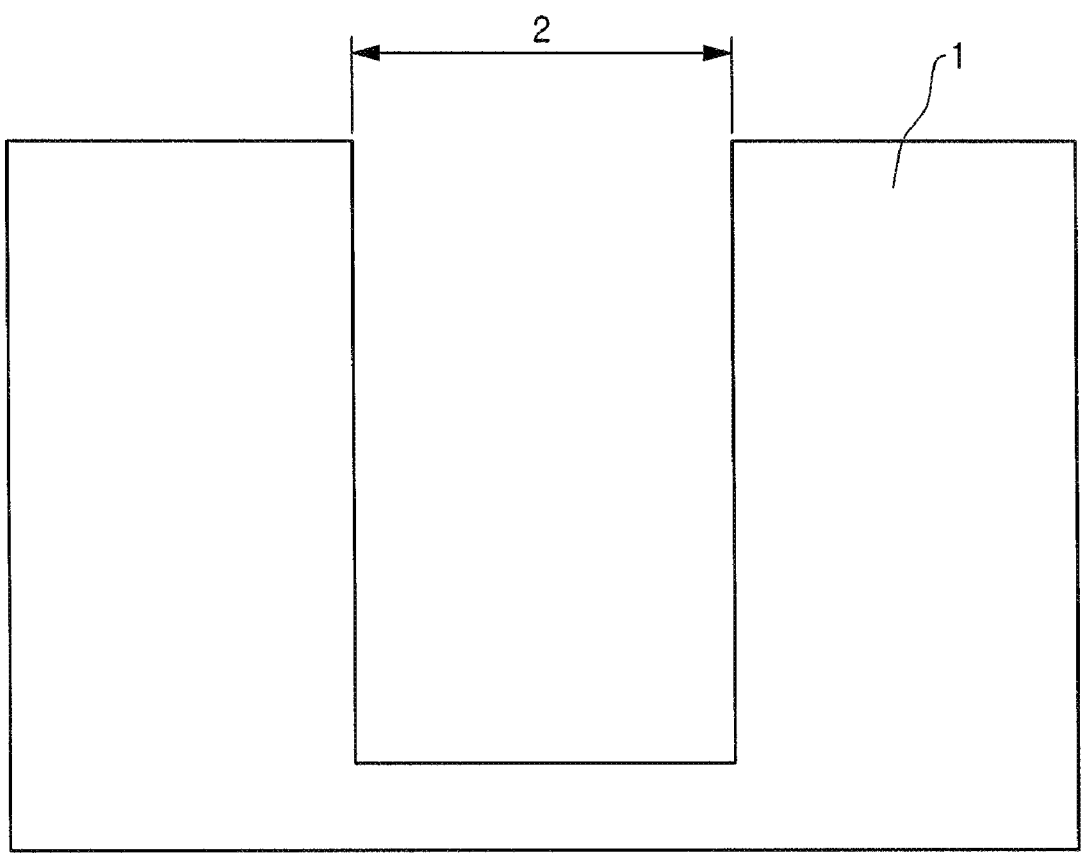

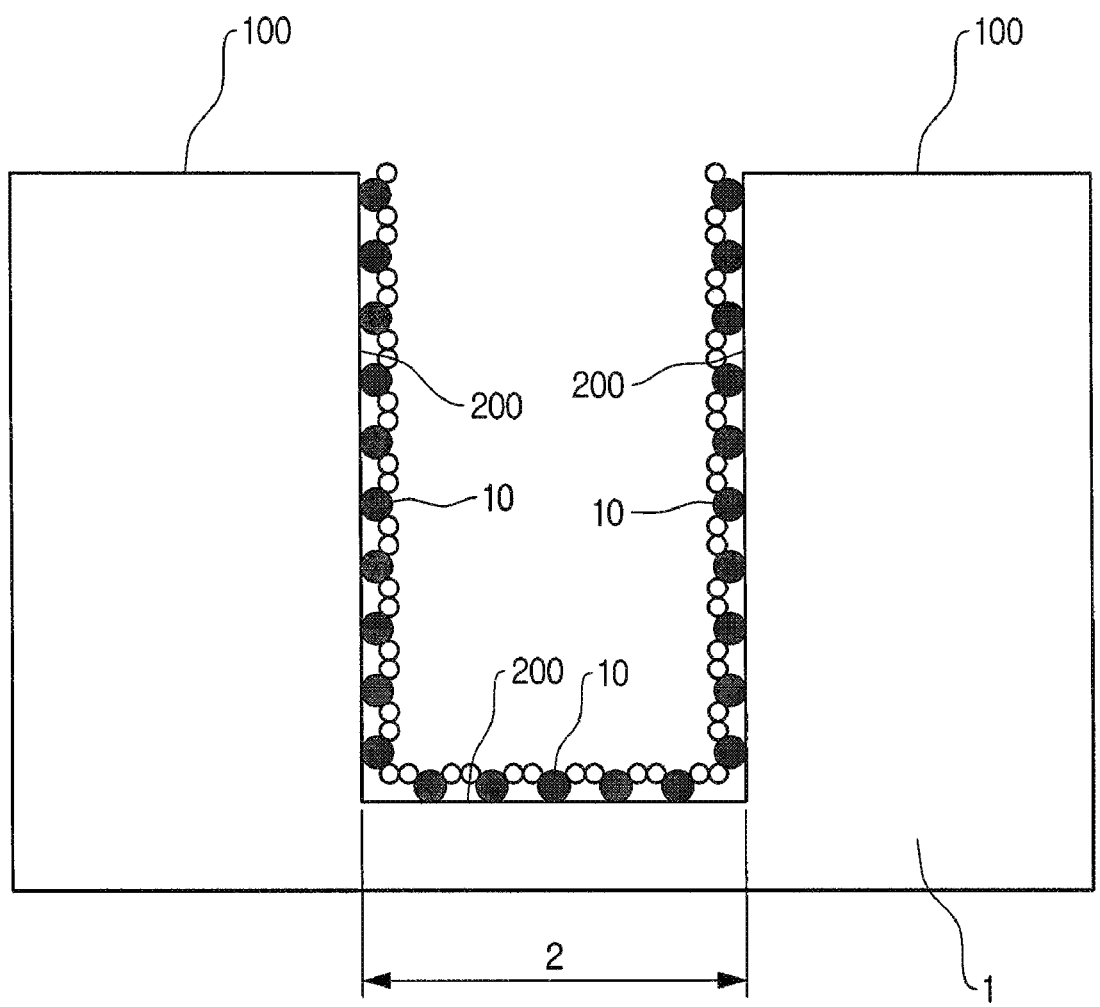

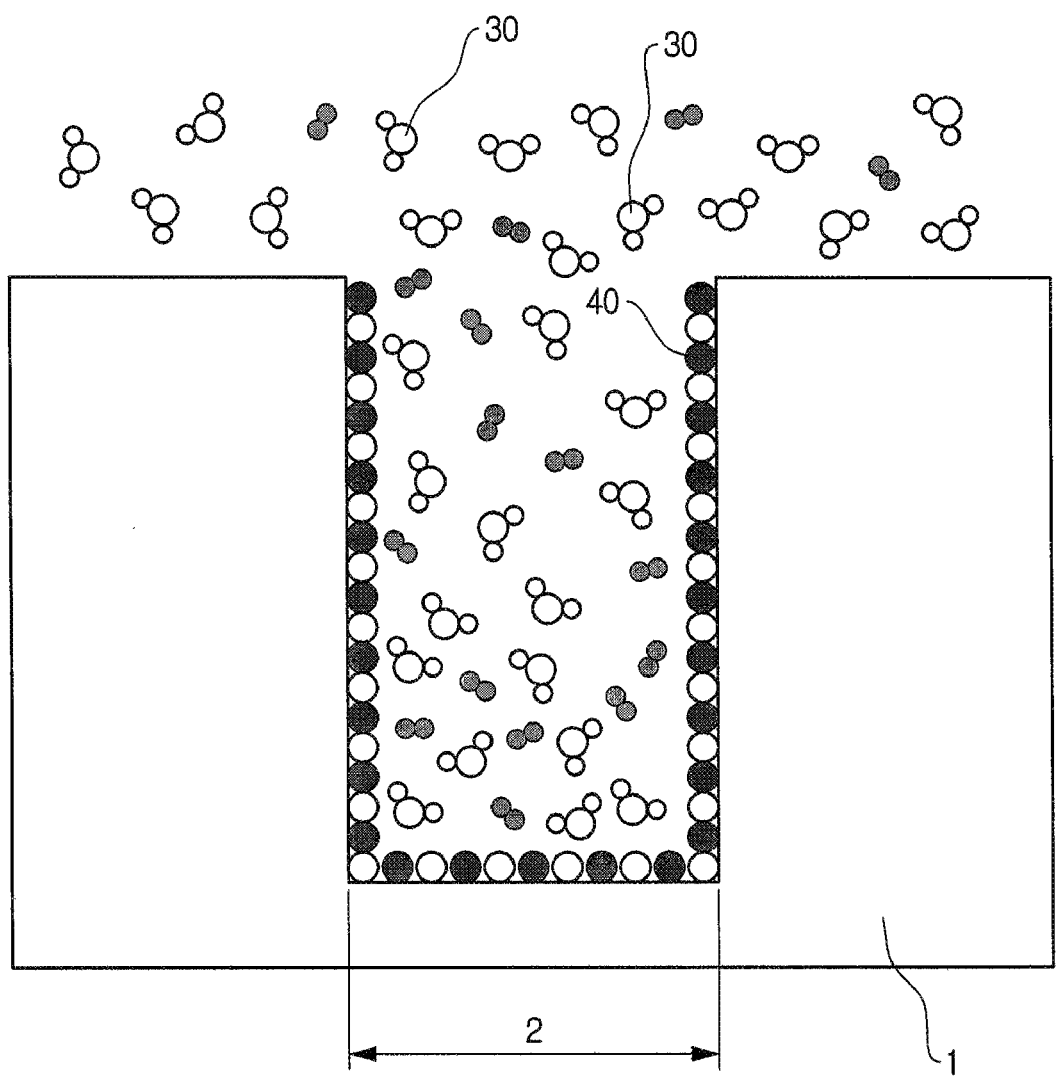

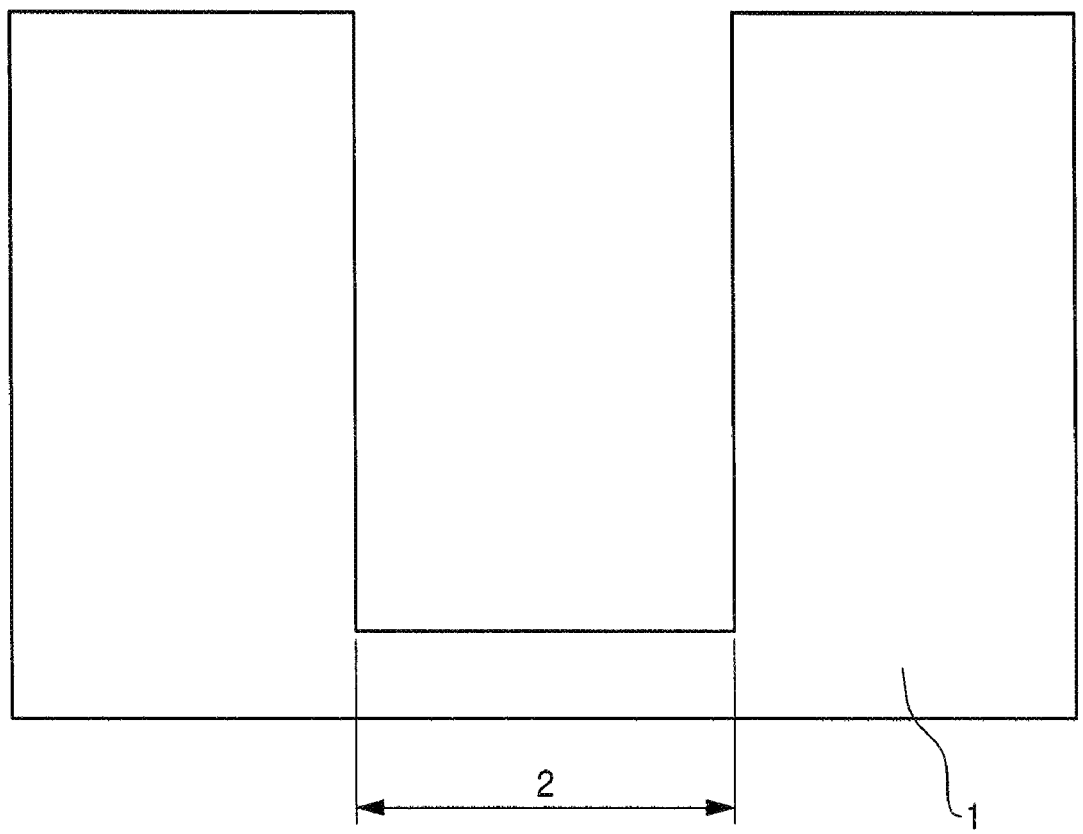

FORMING SUBSTRATE STRUCTURE BY FILLING RECESSES WITH DEPOSITION MATERIAL

CROSS-REFERENCE TO RELATED APPLICATIONS

This application claims priority to co-pending U.S. patent application Ser. No. 12/539,289 entitled "Forming Substrate Structure by Filing Recesses with Deposition Material" filed on Aug. 11, 2009, which claims priority to U.S. Provisional Patent Application No. 61/088,679 entitled "Method of Forming Substrate Structure and Method of Manufacturing Device Comprising the Same" filed on Aug. 13, 2008, which are incorporated by reference herein in their entirety.

BACKGROUND

1. Field of Art

This invention relates to forming a substrate structure with deposition material filling one or more recesses on a substrate.

2. Description of Related Art

Many semiconductor devices include transistors, wirings, insulators and other components formed on a substrate. Conventionally, transistors are insulated from each other using technique such as LOCOS (local oxidation of silicon) or SEPDX (selective poly oxidation). To accommodate semiconductor devices with smaller components for higher level of integration, a technique called STI (Shallow Trench Isolation) was developed. The STI forms trenches around the periphery of a transistor and then fills the trenches with silicon oxide ($SiO_2$). In order to fill the trenches with $SiO_2$, techniques such as atmospheric pressure chemical vapor deposition (APCVD), high density plasma (HDP) oxide deposition, and sub-atmospheric chemical vapor deposition (SACVD) are be used. These conventional techniques, however, are not suitable to fill the trenches in cases where 45 nm or smaller design rules apply, or an aspect ratio of 5:1 or larger applies.

FIG. 1A is a schematic diagram illustrating a substrate 1 with a recess 2 filled using a conventional technique. In FIG. 1A, the recess 2 may be filled with $O_3$-TEOS oxide 3 by SACVD using tetraethyl orthosilicate (TEOS) as a source precursor and using ozone as a reaction precursor. However, the recess 2 may not be filled completely, if the width (or pitch) of the recess 2 is small or the aspect ratio is high. Consequently, voids 4 are formed in the recess, which reduces the reliability of the semiconductor device.

FIG. 1B is a schematic diagram illustrating the substrate 1 with the recess 2 using a conventional technique. FIG. 1B illustrates the recess 2 on the substrate 1 filled using an HDP apparatus implementing chemical vapor deposition (CVD) while controlling the bias of the substrate to etch the substrate. The conventional technique of FIG. 1B reduces overhang of the oxide 5 deposited at the edge of the recess 2 by resputtering. However, the HDP oxide 5 accumulates at the bottom of the recess 2. Hence, this convention technique may cause damage to the substrate 1 by bias or plasma. Further, if the aspect ratio of the recess 2 is high, then the recess 2 may be filled partially, resulting in uneven coating of the substrate 1.

SUMMARY

Embodiments provide a method for forming a substrate structure with one or more recesses filled with a dielectric material, a semiconductor material or metal to provide wirings having advantageous electrical and mechanical properties. A first material layer may be formed on a substrate having one or more recesses. The first material layer may then be removed from portions of the substrate other than surfaces of the recesses by using a second material that reacts with the first material. A deposition film is formed from the first material layer remaining in the recesses using a third material that reacts with the first material.

Embodiments also provide a method of manufacturing a device including a substrate structure formed using such method.

In another embodiment, a substrate structure may be fabricated by forming a deposition film on a substrate having one or more recesses, and removing the deposition film from the substrate other than the surfaces of the recesses using a first material that reacts with the deposition film.

In one embodiment, the deposition film is formed in the one or more recesses on the substrate to fill the interior of the recess with materials such as a dielectric material, a semiconductor material and metal.

BRIEF DESCRIPTION OF THE DRAWINGS

FIG. 2A through FIG. 2I are schematic diagrams illustrating a process of forming a substrate structure, according to an embodiment.

FIG. 3A through FIG. 3I are schematic diagrams illustrating a process of forming a substrate structure, according to another embodiment.

DETAILED DESCRIPTION OF EMBODIMENTS

Hereinafter, reference will now be made in detail to various example embodiments, examples of which are illustrated in the accompanying drawings and described below. While the invention will be described in conjunction with example embodiments, it will be understood that the present description is not intended to limit the invention to those example embodiments. On the contrary, the invention is intended to cover not only the example embodiments, but also various alternatives, modifications, equivalents and other embodiments, which may be included within the spirit and scope of the invention as defined in the appended claims. In the following, description of known functions or constructions which may unnecessarily obscure the subject matter of the present invention will be omitted.

The number and types of atoms or molecules constituting each material are provided in Figures for the purpose of illustration. The present invention is not limited by the number and types of atoms or molecules constituting each material. For example, each material may have a number of molecules different from Figures, and each molecule may have number and types of atoms different from Figures.

FIG. 2A through FIG. 2I are schematic diagrams illustrating a process of forming a substrate structure, according to one embodiment. First, referring to FIG. 2A, a substrate 1 having a recess 2 is prepared. The number, depth, width and shape of the recess 2 illustrated in the FIGS. 2A through 2I are provided merely for the purpose of illustration. In other embodiments, the number, depth, width and shape of the recess may differ.

Figure 1A:
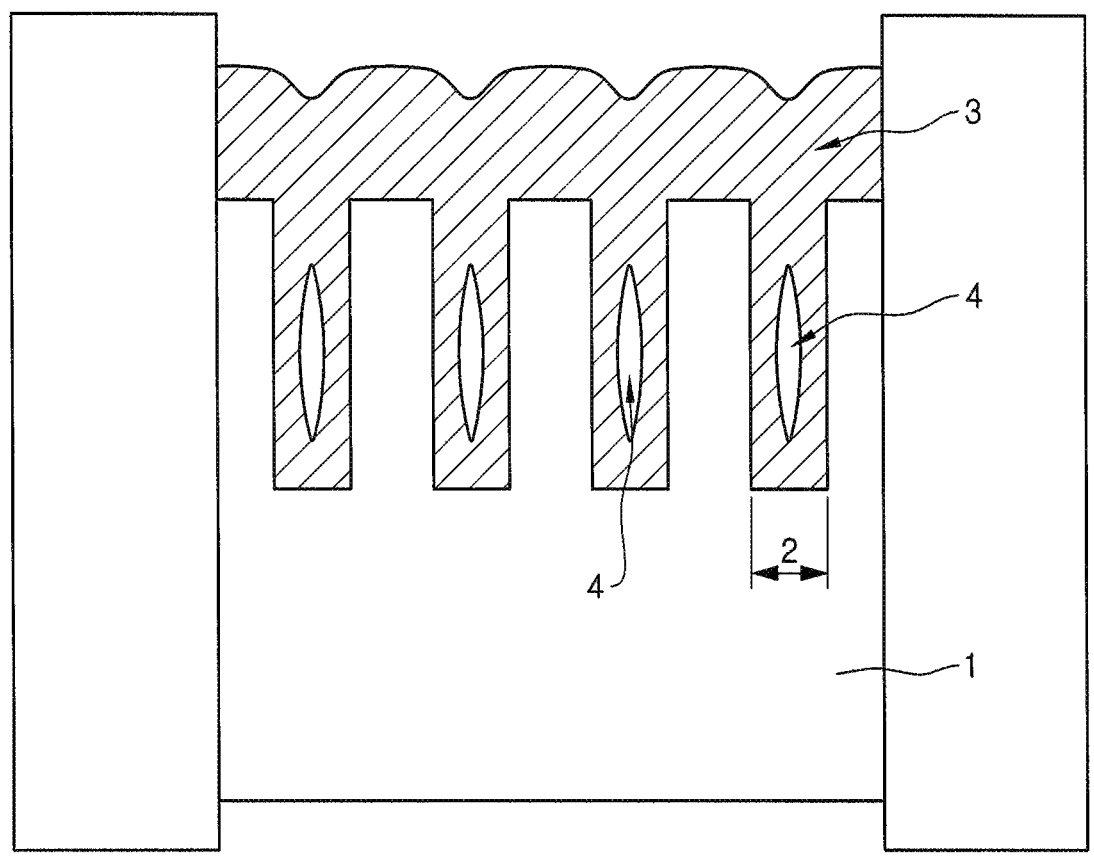
FIG. 1A and FIG. 1B are schematic diagrams illustrating a recess on a substrate filled.
Figure 1B:
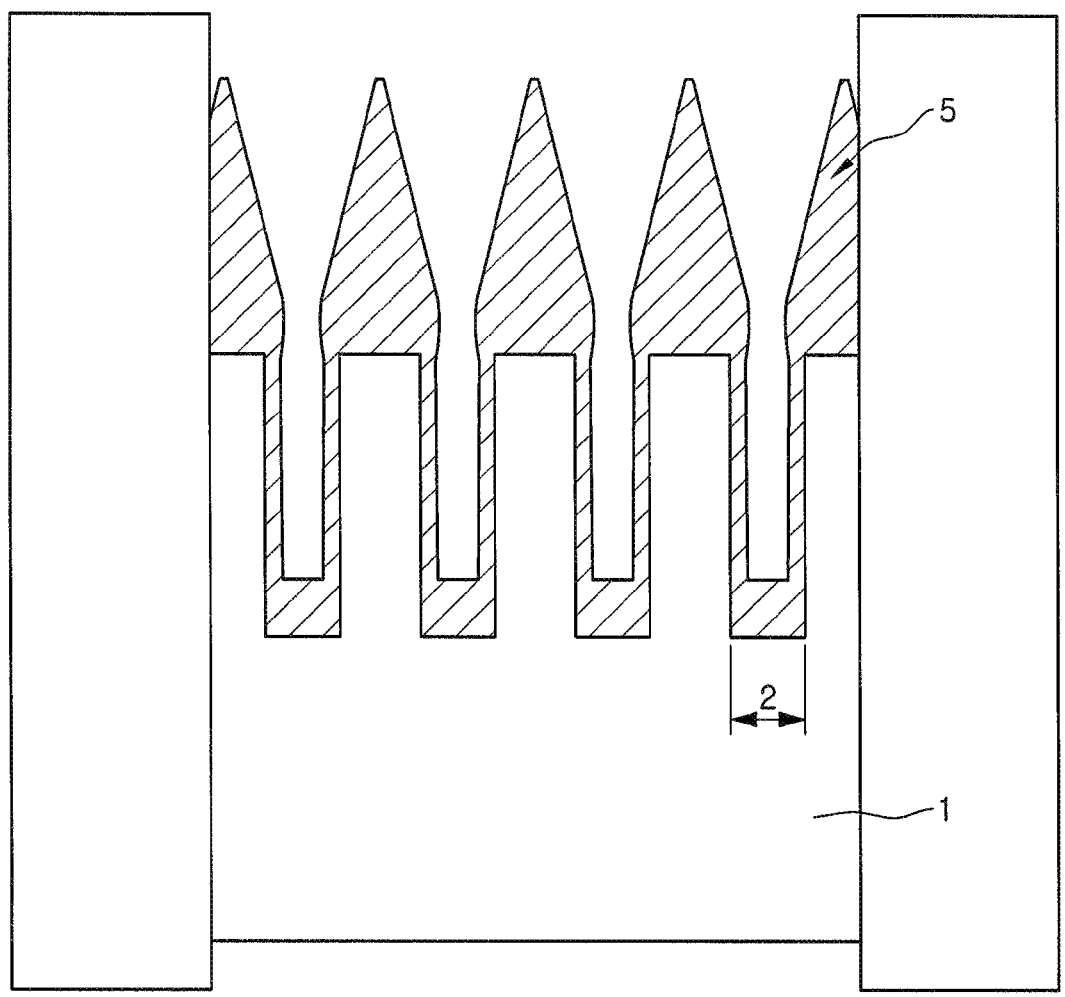
Figure 2B:
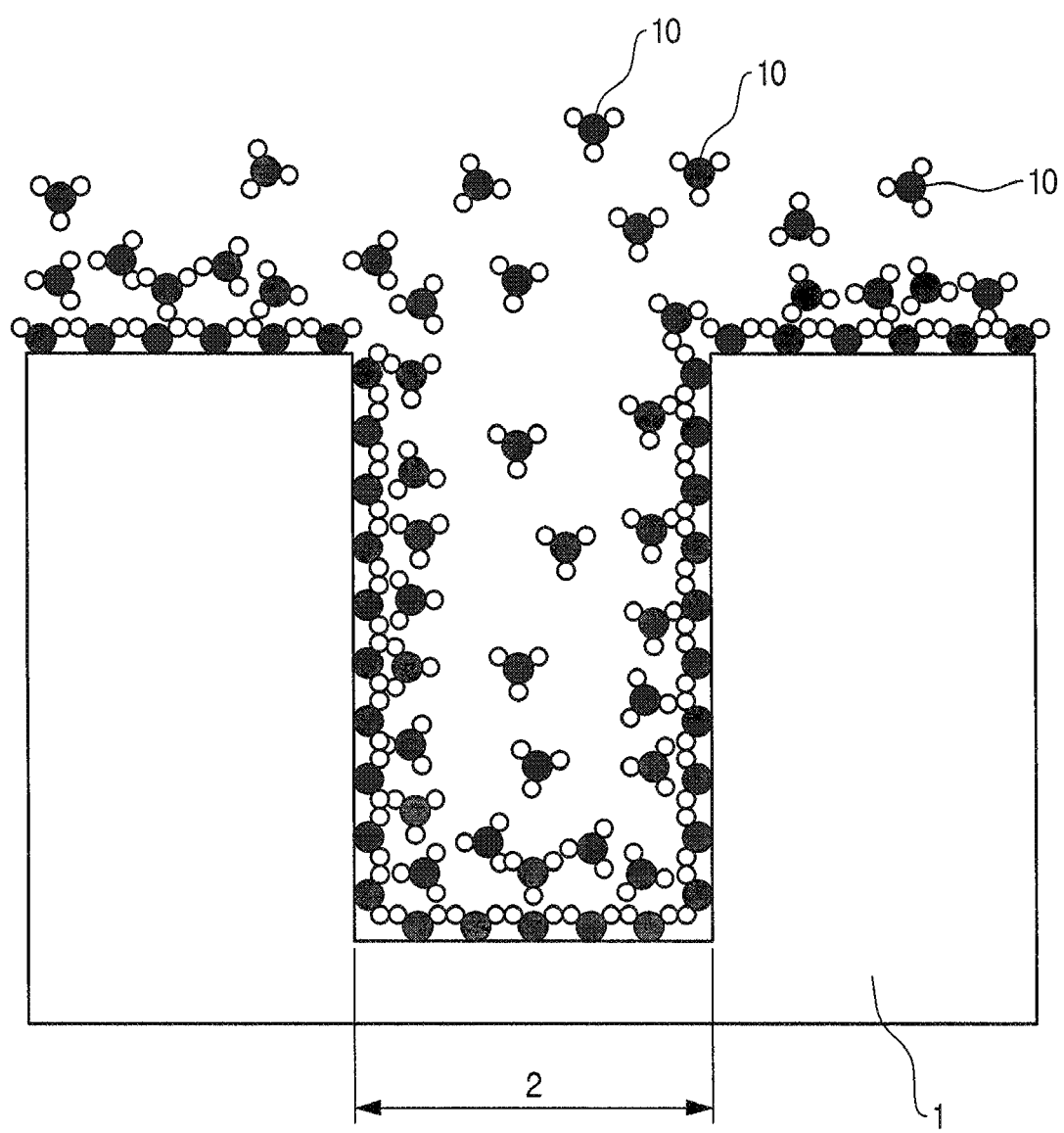
Figure 2C:
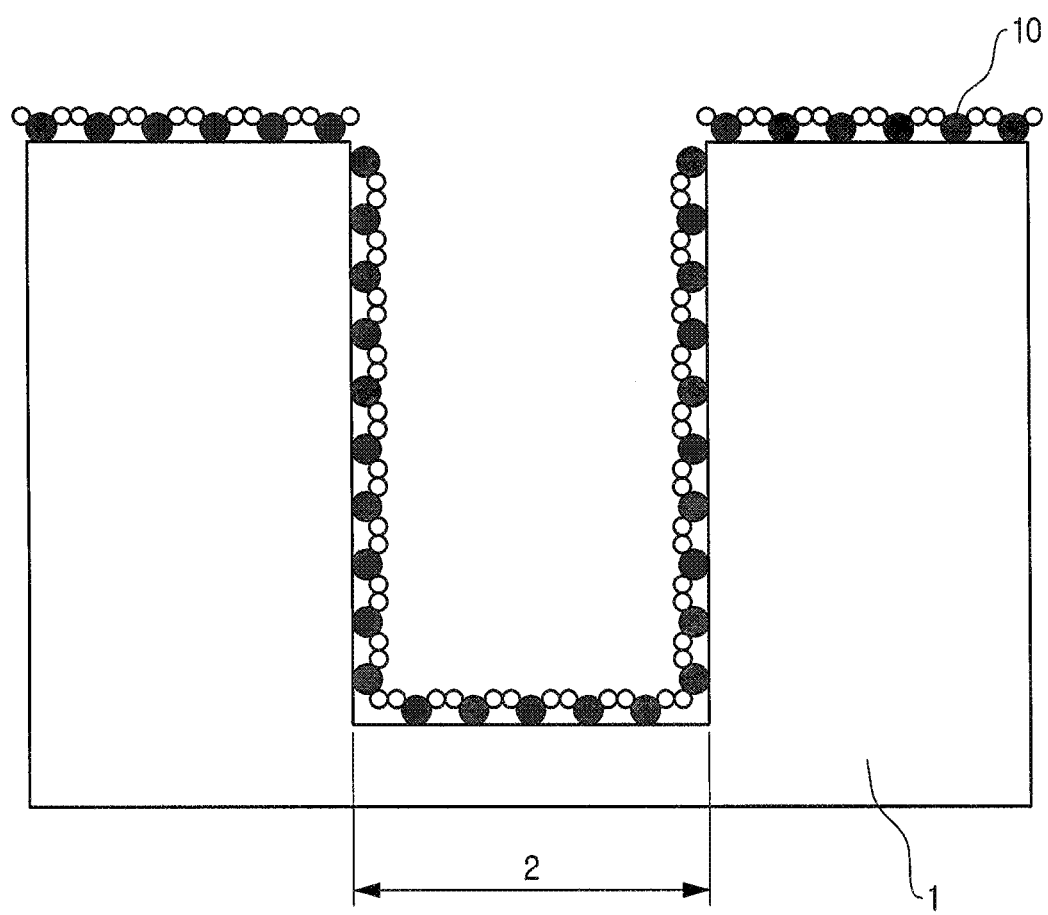

Referring next to FIG. 2B and FIG. 2C, a layer of a first material 10 is formed on the substrate 1 having the recess 2. In one embodiment, the first material 10 is a source precursor for forming a deposition film. Referring to FIG. 2B, the layer of the first material 10 may be formed by exposing the substrate 1 to the first material 10. For example, the substrate 1 may be sprayed with the first material 10. The first material 10 may be sprayed on the substrate 1 in such an amount that the first material 10 is adsorbed chemically and physically on the entire surface of the substrate 1 to saturate the surface of the substrate 1.

In one embodiment, the layer of the first material 10 is formed on the entire surface of the substrate 1 using a showerhead type spray nozzle that exposes the entire surface of the substrate to the first material 10 simultaneously. The layer of the first material may also be formed through atomic layer deposition similar to ejection through the showerhead type spray nozzle. For example, a deposition apparatus having a nozzle for ejecting the first material 10 placed above the substrate 1 is used. Alternatively, the first material 10 may be ejected on the entire surface of the substrate 1 by transferring the substrate 1 while ejecting the file material 10 on a portion of the substrate 1.

In one embodiment, the substrate 1 is exposed to a radical generating apparatus, remote plasma, microwave, electron cyclotron resonance plasma or ultraviolet (UV) light so that the substrate 1 adsorbs the first material 10. It may be difficult to have some silicon-containing compounds chemisorbed on the substrate 1. In such case, the substrate 1 may adsorb the silicon-containing compounds by using radicals or the like, as described above in detail. Further, in one embodiment, a catalyst may be ejected onto the substrate 1.

In one embodiment, when forming a deposition film of a dielectric material in the recess 2, the first material 10 may be a silicon (Si) or aluminum (Al) containing material. For instance, the first material 10 may be an inorganic silicon compound such as a silicon hydride compound or a silicon chloride compound. The first material 10 may comprise at least one of $SiH_4$, $SiCl_4$, $Si_2H_6$, $Si_2Cl_6$, $SiH_2Cl_2$ and $Si_3H_8$.

Alternatively, the first material 10 may be a silicon or aluminum containing organic compound such as an alkyl compound, an alkane compound or an amine compound. For example, the first material 10 may be an alkyl compound having an Si—H bond, such as monomethylsilane (MMS; $CH_3SiH_3$), dimethylsilane (DMS; $(CH_3)_2SiH_2$), trimethylsilane (TMS; $(CH_3)_3SiH$), monoethylsilane $(C_2H_5SiH_3)$, diethylsilane $((C_2H_5)_2SiH_2)$, triethylsilane $((C_2H_5)_3SiH)$ and 1,3-disilabutane $(CH_3CH_2SiH_2SiH_3)$.

Alternatively, the first material 10 may be an alkoxide compound having an Si—H bond, such as trimethoxysilane $(SiH(OCH_3)_3)$ or triethoxysilane $(SiH(OC_2H_5)_3)$. Further, the first material 10 may be a siloxane compound having an Si—H bond, such as tetramethyldisiloxane (TMDSO; $(CH_3)_2HSi$—O—$SiH(CH_3)_2$).

Further, the first material 10 may be a silicon-containing amine compound, such as hexamethyldisilazane (HMDS; $(CH_3)_3Si$—NH—$Si(CH_3)_3$) or a compound modified therefrom.

Still further, the first material 10 may be an aluminum-containing alkyl compound, such as trimethylaluminum (TMA; $Al(CH_3)_3$), dimethylaluminum hydride (DMAH; $Al(CH_3)_2H$)), dimethylaluminum isopropoxide (DMAIP; $(CH_3)_2AlOCH(CH_3)_2$)) or a compound modified therefrom.

Further, the first material 10 may be an aluminum-containing amine compound, such as dimethylethylaminoaluminum (DMEAA; $AlH_3N(CH_3)_2(C_2H_5)$) or a compound modified therefrom.

In another embodiment, a deposition film of a semiconductor material may be formed in the recess 2. In this case, the first material 10 may be a silicon-containing inorganic compound, a germanium (Ge)-containing inorganic compound, or a carbon compound. For example, the first material 10 may be a silicon or germanium containing hydrogen compound or a silicon or germanium containing chlorine compound comprising at least one of $SiH_4$, $SiCl_4$, $Si_2H_6$, $Si_2Cl_6$, $SiH_2Cl_2$, $Si_3H_8$, $GeH_4$, $GeCl_4$, $Ge_2H_6$, $Ge_2Cl_6$, $GeH_2Cl_2$ and $Ge_3H_8$.

Alternatively, when forming carbon-doped silicon in the recess 2, the first material 10 may be a carbon compound, including an alkane compound such as $CH_4$, $C_2H_6$ and $C_3H_8$, or an alkyl compound such as $(CH_3)SiH_3$, $(CH_3)GeH_3$, $(C_2H_5)SiH_3$ and $(C_2H_5)GeH_3$.

Further, when forming an oxide semiconductor such as ZnO, NiO, CeO or EuO in the recess 2, the first material 10 may be an alkyl compound or a compound modified therefrom.

Still further, when forming a nitride semiconductor such as AlN, GaN or InN in the recess 2, the first material 10 may be an alkyl compound, such as dimethylaluminum hydride, trimethylaluminum, triethylaluminum, trimethylgallium (TMG; $Ga(CH_3)_3$), trimethylgallium (TEG; $Ga(C_2H_5)_3$), trimethylindium (TMI; $In(CH_3)_3$), trimethylindium (TEI; $In(C_2H_5)_3$)) or a compound modified therefrom. Also, in this case, the first material 10 may be an amine compound, such as dimethylethylaminealuminum, dimethylaminobutylaluminum and a compound modified therefrom.

In still another example embodiment, a deposition film of a metal material, a high melting point compound or a metal-silicon compound may be formed in the recess 2. In this case, the first material 10 may comprise at least one of an inorganic metal compound, an alkyl compound and a compound modified therefrom. For example, the first material 10 is an inorganic metal compound such as $AlCl_3$, $TiCl_4$, $TaCl_5$, $WF_6$, etc, an alkyl compound such as trimethylaluminum, triethylaluminum, dimethylaluminum hydride and a compound modified therefrom.

Referring next to FIG. 2C, the first material except for the first material layer 10 that is chemisorbed on the substrate 1 may be removed by ejecting a purge gas onto the substrate and pumping out the purge gas. The purge gas may be an inert gas such as argon (Ar). The bonding strength of the chemisorption tends to be stronger than physisorption. Accordingly, it is possible to remove, through the purge gas, the physisorbed molecules while retaining only the chemisorbed layer of the first material 10 on the substrate 1.

Figure 2D:
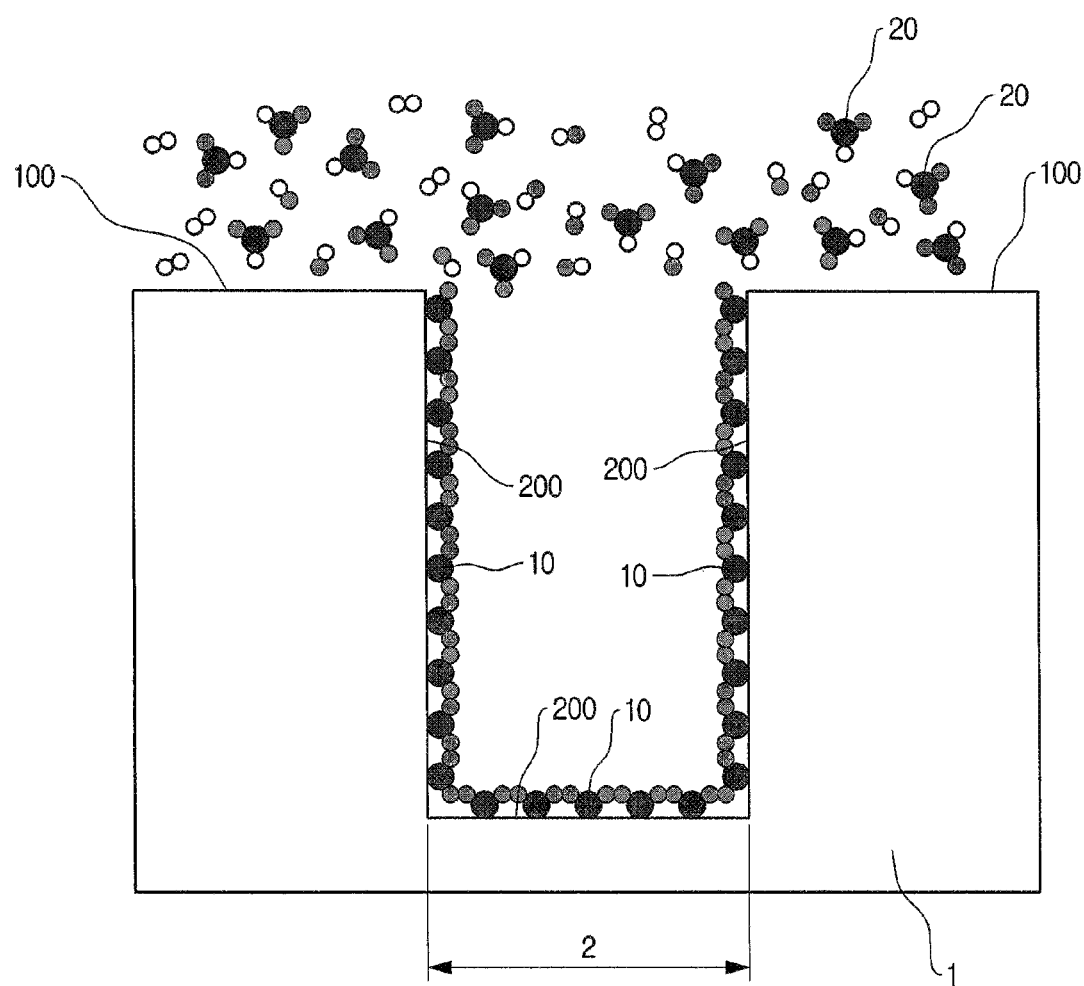

Referring next to FIG. 2D and FIG. 2E, the first material layer 10 is removed from the portion of the substrate 1 other than the surfaces of the recess 2, using a second material 20. Referring to FIG. 2D, the substrate 1 on which the first material layer 10 is formed may be exposed to the second material 20. The duration for exposing the substrate 1 to the second material 20 may be controlled such that the second material 20 does not diffuse into the recess 2 of the substrate 1. To this end, the duration for exposing the substrate 1 to the second material 20 may be controlled to prevent the second material 20 from entering the recess 2. An injector (not illustrated) separated from the substrate 1 may eject the second material 20 onto the substrate 1.

The second material 20 may be ejected with a predetermined speed. The time required for the second material 20 to reach the substrate 1 may be calculated from (i) the distance between the substrate 1 and the injector, and (ii) the ejection speed of the second material 20. The duration for ejecting the second material 20 is controlled so that the ejection is stopped as soon as the second material 20 reaches the substrate 1. In this way, diffusing of the second material 20 into the recess 2 of the substrate 1 may be prevented.

The duration for ejecting the second material 20 onto the substrate 1 may be controlled to provide an extremely short burst of the second material. Hence, an injector or a showerhead with a superior uniformity may be used to inject the second material 20 onto the substrate 1. The substrate 1 may be fixed by a variable susceptor that controls the distance between the injection outlet of the second material 20 and the substrate 1.

In another embodiment, a scanning type deposition apparatus is used to deposit the second material 20. The scanning type deposition apparatus deposits the second material 20 onto the substrate 1 by moving the substrate 1 while exposing the substrate 1 to the second material 20. For instance, the substrate 1 is placed on a conveyer (not illustrated) and moved at a controlled speed in a region where the substrate 1 is exposed to the second material 20. By controlling the speed of the conveyer, it is possible to prevent the second material 20 from entering the recess 2. That is, the substrate 1 is exposed to the second material 20 and then transferred by the conveyer out of the region before the second material 20 diffuses into the recess 2 of the substrate 1. Besides preventing the second material 20 from diffusing into the recess 2, moving the substrate 1 via the conveyer is advantageous because the overall productivity (throughput) of producing the substrate 1 may be increased by increasing the transfer rate of the substrate 1.

In still another embodiment, when using radicals such as hydrogen radicals produced from remote plasma as the second material 20, the distance between the remote plasma and the substrate 1 may be controlled such that the second material 20 is not diffused into the recess 2. Radicals have relatively short lifetime. Hence, by positioning the substrate 1 so that the time required for the radicals to reach the substrate 1 is equal to or approximate the lifetime of the radicals, it is possible to prevent the radicals from diffusing into the recess 2. The plasma used for this purpose may be parallel plate plasma produced in parallel to the substrate, inductive coupled plasma produced using a coil, many arc plasma in which a plurality of plasma arcs are produced in parallel to the substrate, or the like.

Further, in one embodiment, when the second material 20 is activated by UV (Ultraviolet) light to react with the first material 10, it is possible to control the incident angle of UV light such that the second material 20 does not react with the first material 10 in the recess 2, as described below in detail with reference to FIG. 5.

The above descriptions are given for the purpose of illustration only. In other embodiments, it is possible prevent the first material 10 from reacting with the second material 20 in the recess 2 of the substrate 1 in a different manner. As a result, the second material 20 may react with the first material layer 10 on the portion 100 of the substrate 1 other than the surfaces of the recess 2.

By reacting with the first material 10, the second material 20 may remove the first material layer 10 from the substrate 1. For this purpose, the second material 20 may be a reactive gas capable of reacting with the first material 10 to form a volatile material.

In one embodiment, the second material 20 comprises at least one of hydrogen, chlorine, fluorine and radicals thereof. For example, the second material 20 may comprise at least one of HCl, $BCl_3$, $ClF_3$ and $NF_3$.

In one embodiment, the substrate 1 is exposed to remote plasma, a radical generation apparatus, microwave, electron cyclotron resonance plasma or UV light depending on the second material such that the first material 10 reacts with the second material 20. In this case, the incident angle of UV light may be controlled such that the second material 20 does not react with the first material 10 in the recess 2, as described below in detail with reference to FIG. 5.

Referring to FIG. 2E, in one embodiment, purging may be carried out after the second material 20 reacts with the first material 10. By using the purge gas, the volatile material produced as a result of the reaction between the second material 20 and the first material 10, and the second material 20 remaining after the reaction may be removed. This process removes the first material layer 10 from the portion 100 of the substrate 1 other than the surfaces of the recess 2, leaving behind only the first material 10 adsorbed in the surface 200 of the recess 2.

Figure 2G:
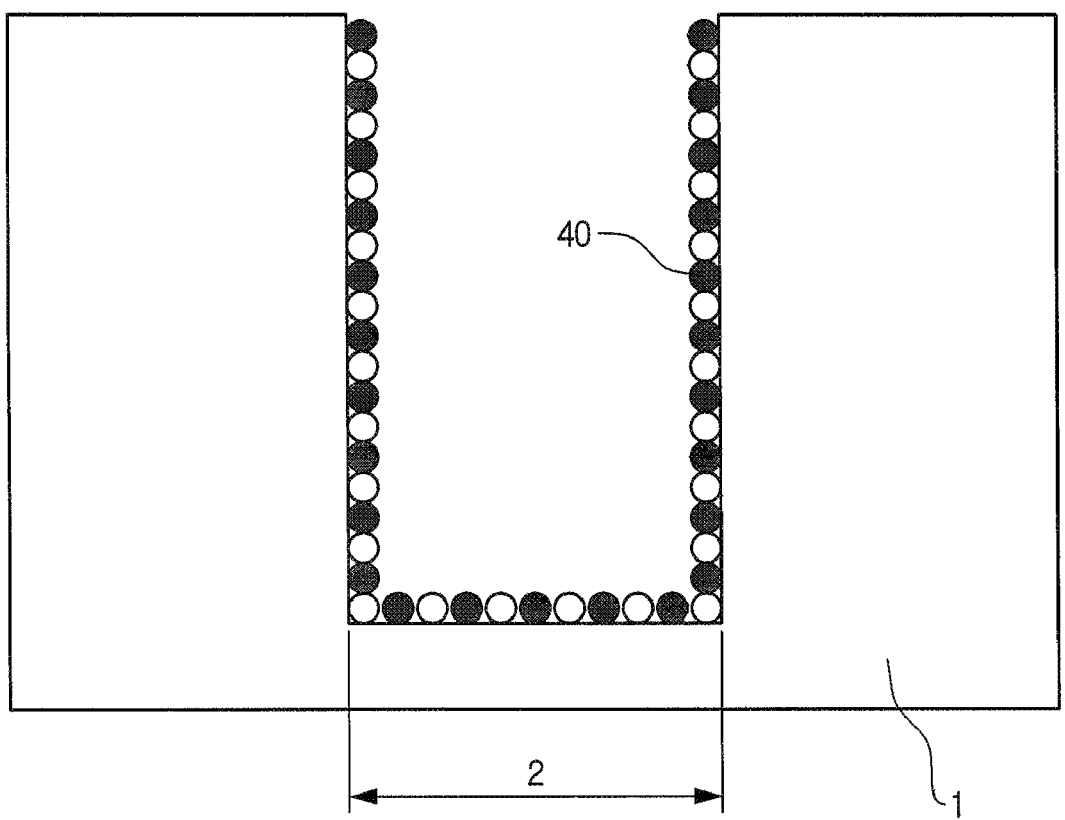

Referring next to FIG. 2F and FIG. 2G, a deposition film 40 may be formed in the recess 2 based on the first material layer 10. Referring to FIG. 2F, a third material 30 is exposed to the substrate 1 where the first material layer 10 is formed in the recess 2. The third material 30 may react with the first material layer 10 to form the deposition film 40 in the recess 2. That is, the third material 30 may be a reaction precursor for forming the deposition film 40.

In one embodiment, a deposition film 40 comprising a dielectric material such as oxide or nitride may be formed depending on the first material layer 10. For instance, the deposition film 40 comprises at least one of $SiO_2$, PSG, BPSG, SiN, $Al_2O_3$ and AlN.

If the deposition film 40 comprises an oxide, the third material 30 may comprise at least one of $H_2O$, $H_2O$ plasma, $O_2$, $O_2$ plasma, $N_2O$, $N_2O$ plasma and $O_3$. If the deposition film 40 comprises a nitride, the third material 30 may comprise at least one of $NH_3$, $NH_3$ plasma and $N_2$ plasma.

In one embodiment, a deposition film 40 comprising a semiconductor material is formed depending on the first material layer 10. For instance, the deposition film 40 comprises Si, Ge, $Si_xGe_{1-x}$, (0<x<0.5), boron-doped Si, phosphorus-doped Si or carbon-doped Si. Further, the deposition film 40 is formed of an oxide semiconductor such as ZnO, NiO, CeO, and EuO or a nitride semiconductor such as AlN, GaN, and InN. In this case, the third material 30 may comprise at least one of nitrogen radical, $NH_3$ plasma and $N_2$ plasma.

In one embodiment, the deposition film 40 is formed of a metal material, a high melting point compound or a metal-silicon compound. For instance, deposition film 40 includes at least one of a metal material such as Al, Ti, Ta, W, and Cu; a high melting point compound such as TiN, TaN, and WNmetal compound such as GeSbTe, CuInGaSe; or a metal-silicon compound compound such as NiSi, CoSi, and TiSi.

Referring next to FIG. 2G, excess third material 30 is removed by purging after the reaction, as described above in detail with reference to FIG. 2C. As a consequence, the deposition film 40 is formed in the recess 2 of the substrate 1. In FIG. 2G, the deposition film 40 is depicted as consisting of two different atoms. This is only illustrative. The deposition film 40 may consist of a single atom or more than three different atoms.

Figure 2H:
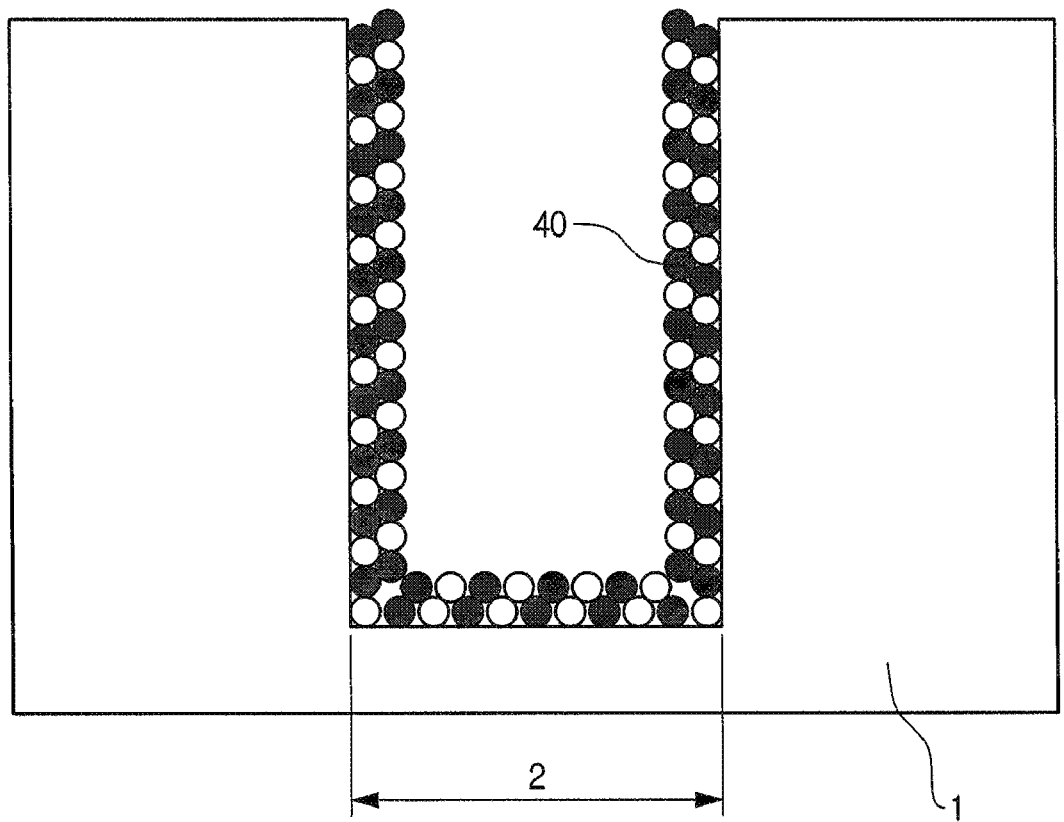
Figure 2I:
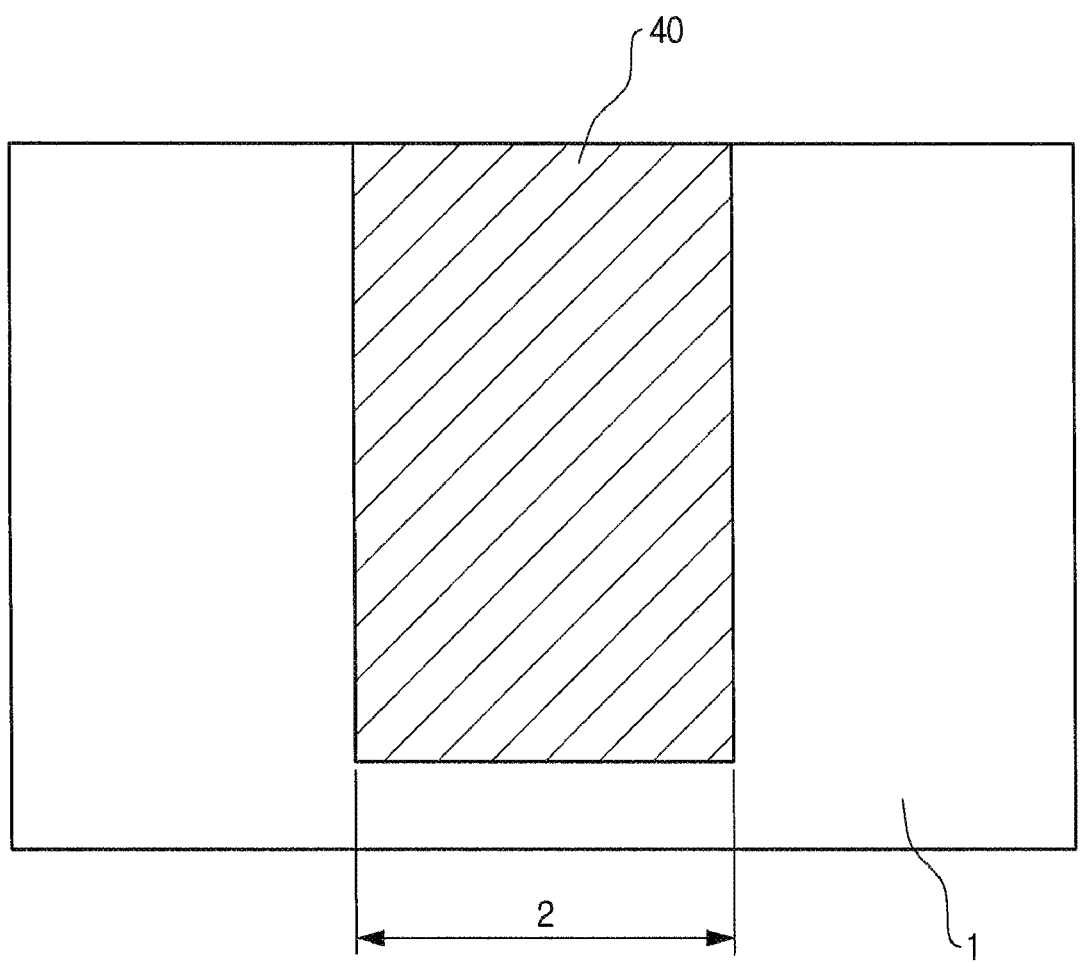

As illustrated in FIG. 2H, multiple layers of the deposition film 40 are formed in the recess 2 of the substrate 1 by repeating the processes, described above in detail with reference to FIG. 2B through FIG. 2G. As illustrated in FIG. 2I, the recess 2 of the substrate 1 may be completely filled with the deposition film 40 by repeating the processes, described above in detail with reference to FIG. 2B through FIG. 2G.

Figure 3B:
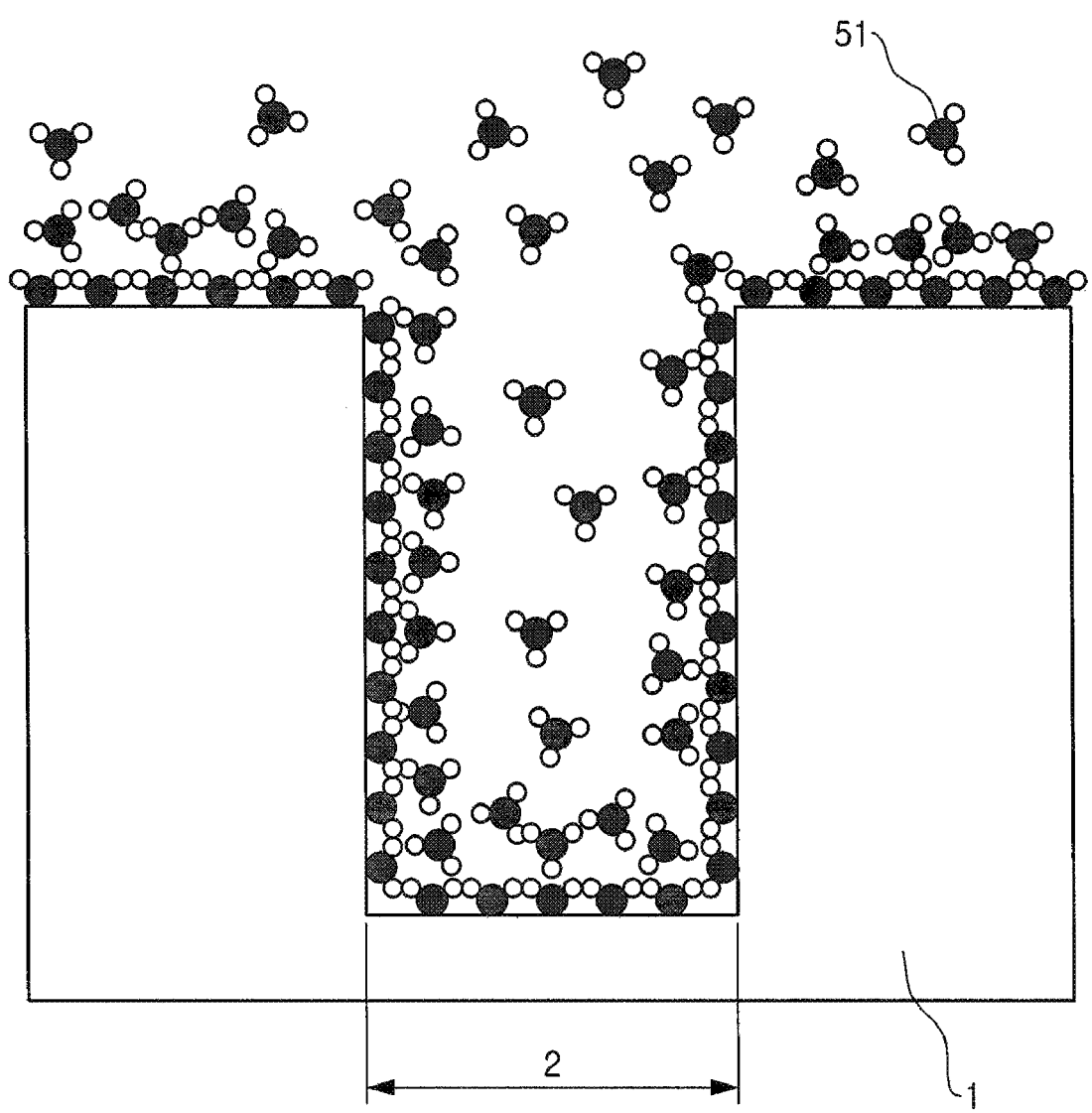

FIG. 3A through FIG. 3I are schematic diagrams illustrating a method of forming a substrate structure, according to another embodiment. Referring to FIG. 3A, a substrate 1 having a recess 2 is prepared. The number, depth, width and shape of the recess illustrated in the Figures are merely for the purpose of illustration, and they may be varied.

Figure 3C:
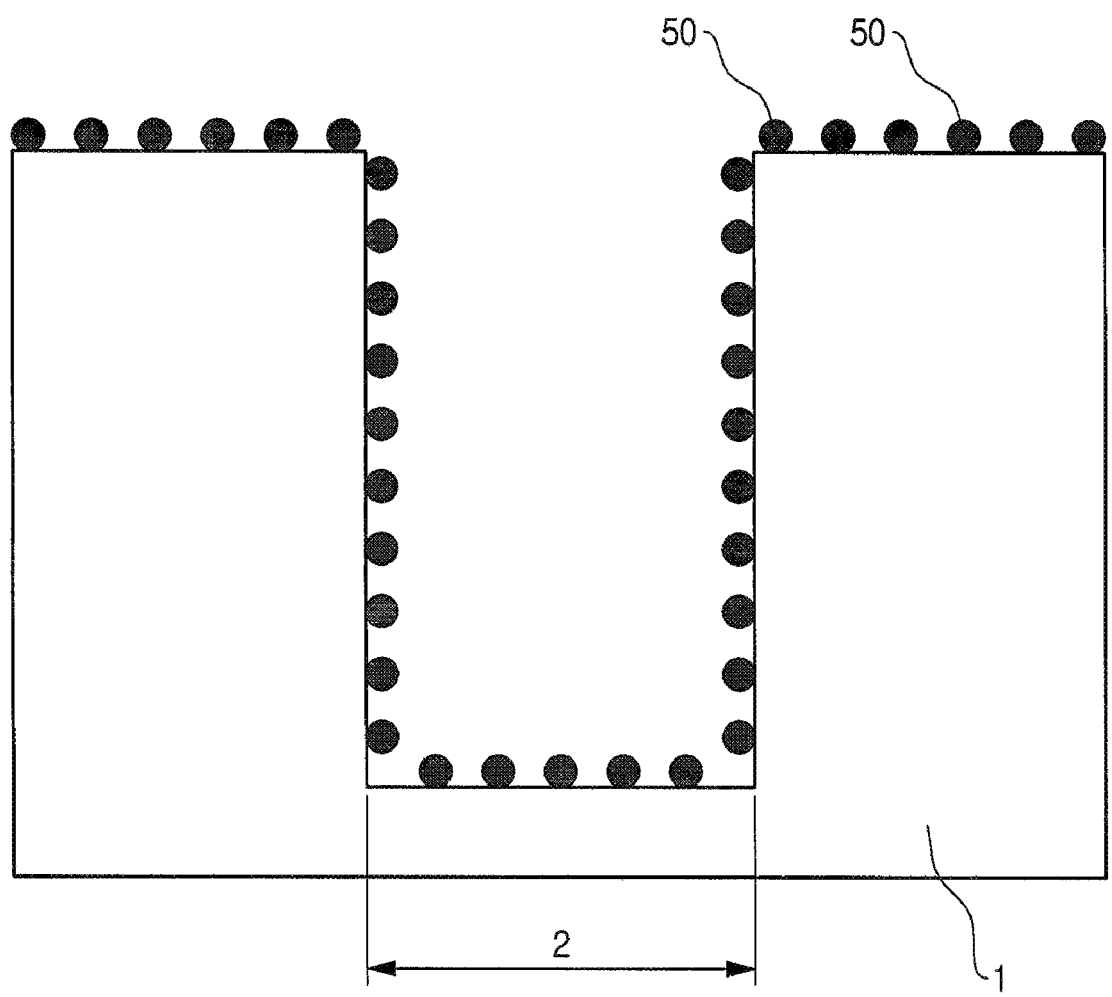

Referring next to FIG. 3B and FIG. 3C, a deposition film 50 is formed on the substrate 1 having the recess 2. In one embodiment, the deposition film 50 is formed by atomic layer deposition to expose the substrate 1 to a source precursor 51 and a reaction precursor (not illustrated). The substrate 1 may be exposed simultaneously to the source precursor 51 and the reaction precursor.

In one embodiment, the deposition film 50 is an atomic layer comprising silicon, aluminum or titanium. In this case, the deposition film 50 may be formed by plasma-enhanced atomic layer deposition to deposit a source material onto the substrate 1 using plasma.

The deposition film 50 may be a silicon atomic layer. In this case, the deposition film 50 comprising silicon may be formed by exposing the substrate 1 to the source precursor 51 and the reaction precursor. The source precursor 51 may comprise a silicon-containing inorganic compound such as a silicon hydride compound or a silicon chloride compound; or a silicon-containing organic compound such as an alkyl compound, an alkane compound or an amine compound.

Alternatively, the deposition film 50 may be an aluminum atomic layer. In this case, the source precursor 51 may be an aluminum-containing organic compound.

Alternatively, the deposition film 50 is a titanium (Ti) atomic layer. In this case, the source precursor 51 may comprise, for example, $TiCl_4$.

The deposition film 50 may be formed by reaction between the source precursor 51 and the reaction precursor. In this embodiment, the reaction precursor comprises hydrogen plasma.

Referring next to FIG. 3C, a purge method is performed to remove excess reaction precursor and source precursor and to form the atomic layer type deposition film 50 on the substrate 1.

Figure 3D:
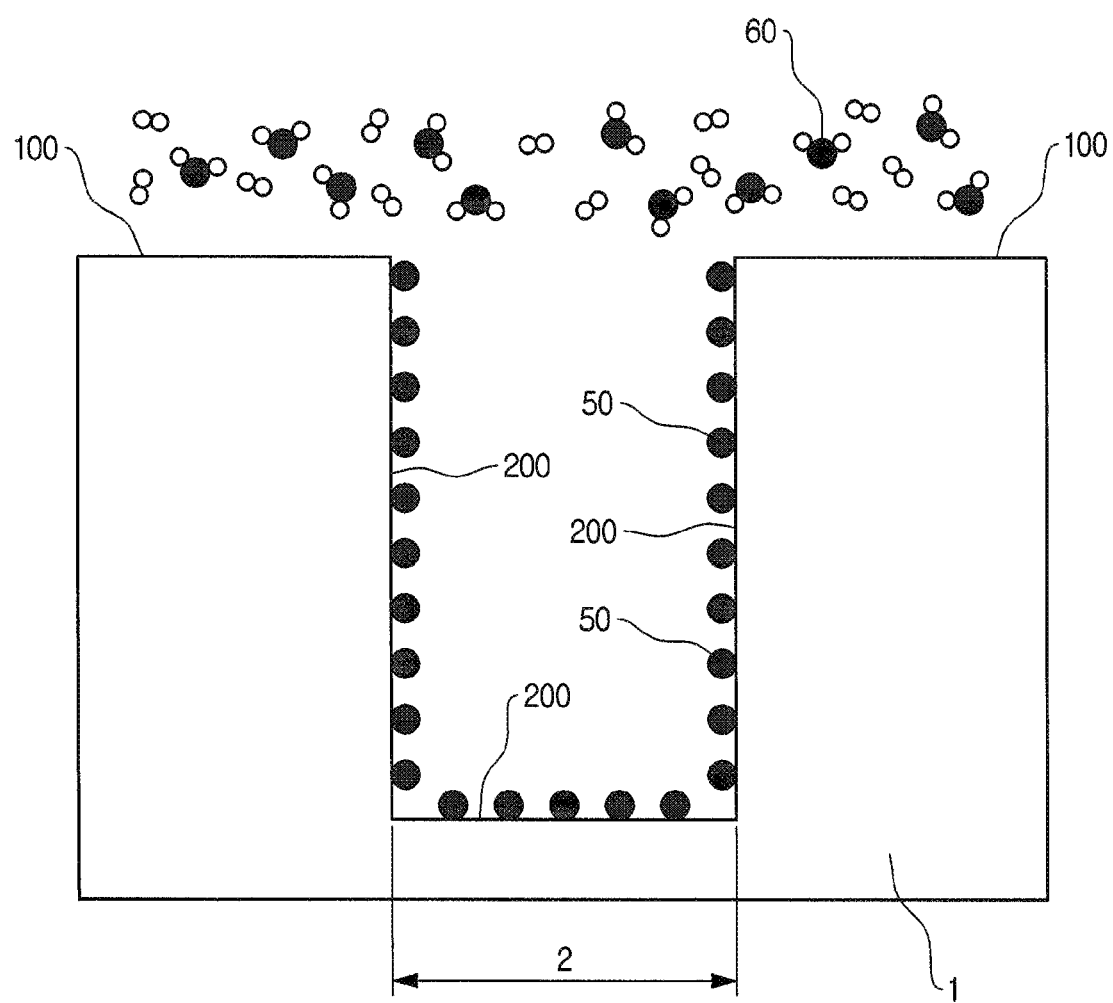
Figure 3E:
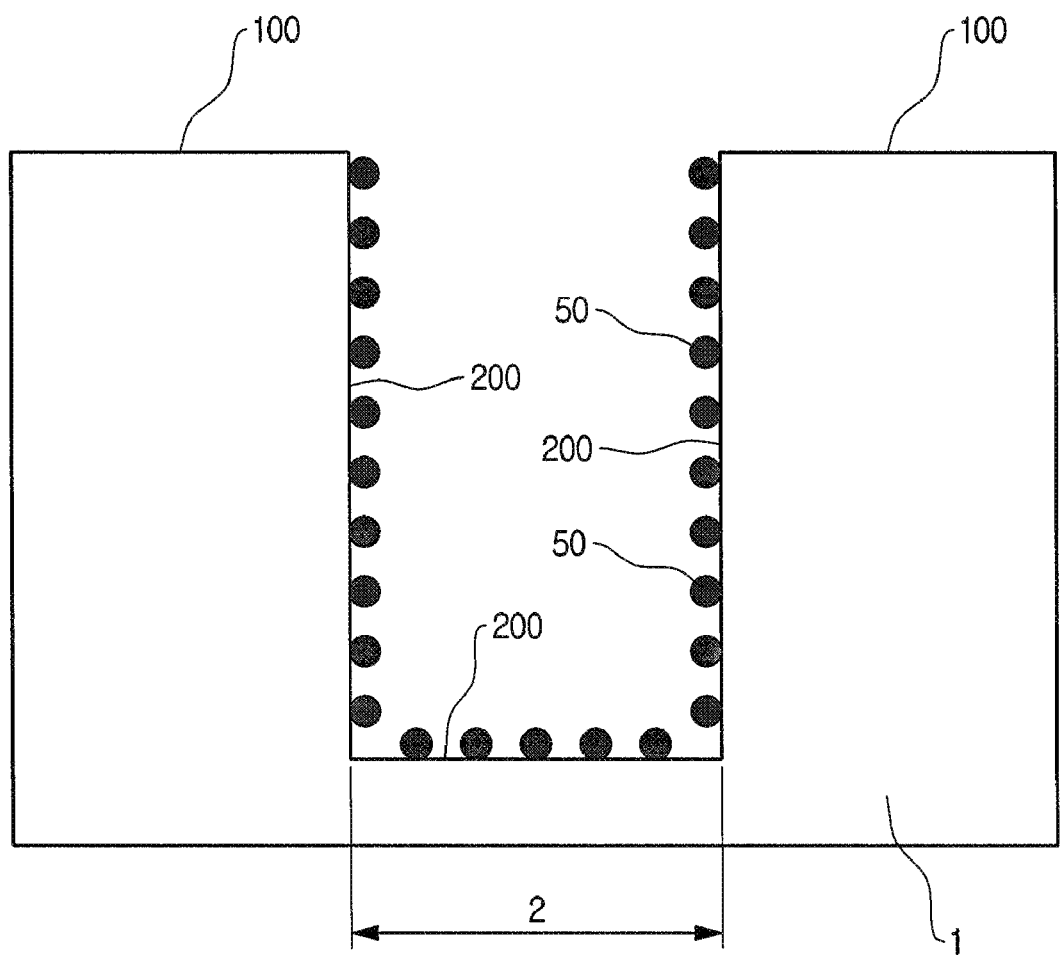

Referring next to FIG. 3D and FIG. 3E, the deposition film 50 may be removed from the portion of the substrate 1 other than the surfaces of the recess 2 using a first material 60. Referring to FIG. 3D, the substrate 1 with the first deposition film 50 is exposed to the first material 60. The duration for exposing the substrate 1 to the first material 60 may be controlled such that the first material 60 does not diffuse into the recess 2 of the substrate 1. Example ways of preventing the first material 60 from entering the recess 2 are described above in detail with reference to FIG. 2D.

The first material 60 may react with the deposition film 50 formed on the substrate 1 to remove the deposition film 50 from the substrate 1. For this purpose, the first material 60 may be a reactive gas that reacts with the deposition film 50 to form a volatile material.

In one embodiment, the first material 60 comprises at least one of hydrogen, chlorine, fluorine and radicals thereof. For example, the first material 60 comprises at least one of HCl, $BCl_3$, $ClF_3$ and $NF_3$.

In one embodiment, the substrate 1 is exposed to remote plasma, a radical generation apparatus, microwave, electron cyclotron resonance plasma or UV light, depending on what the first material 60 is, such that the deposition film 50 may be removed from the substrate 1.

In one embodiment, when the first material 60 is activated by UV light to react with the deposition film 50, it is possible to control the incident angle of UV light such that the first material 60 does not react with the deposition film 50 in the recess 2, as described below in detail with reference to FIG. 5.

Referring to FIG. 3E, one embodiment is illustrated where purging is performed using, for example, an inert gas after the first material 60 reacts with the deposition film 50. By using the purge method, the volatile material produced from the reaction of the first material 60 and the deposition film 50, and excess first material 60 may be removed. As a consequence, the deposition film 50 may be removed from the portion 100 of the substrate 1 other than the surfaces of the recess 2, leaving behind only the deposition film 50 on the surface 200 of the recess 2.

Figure 3F:
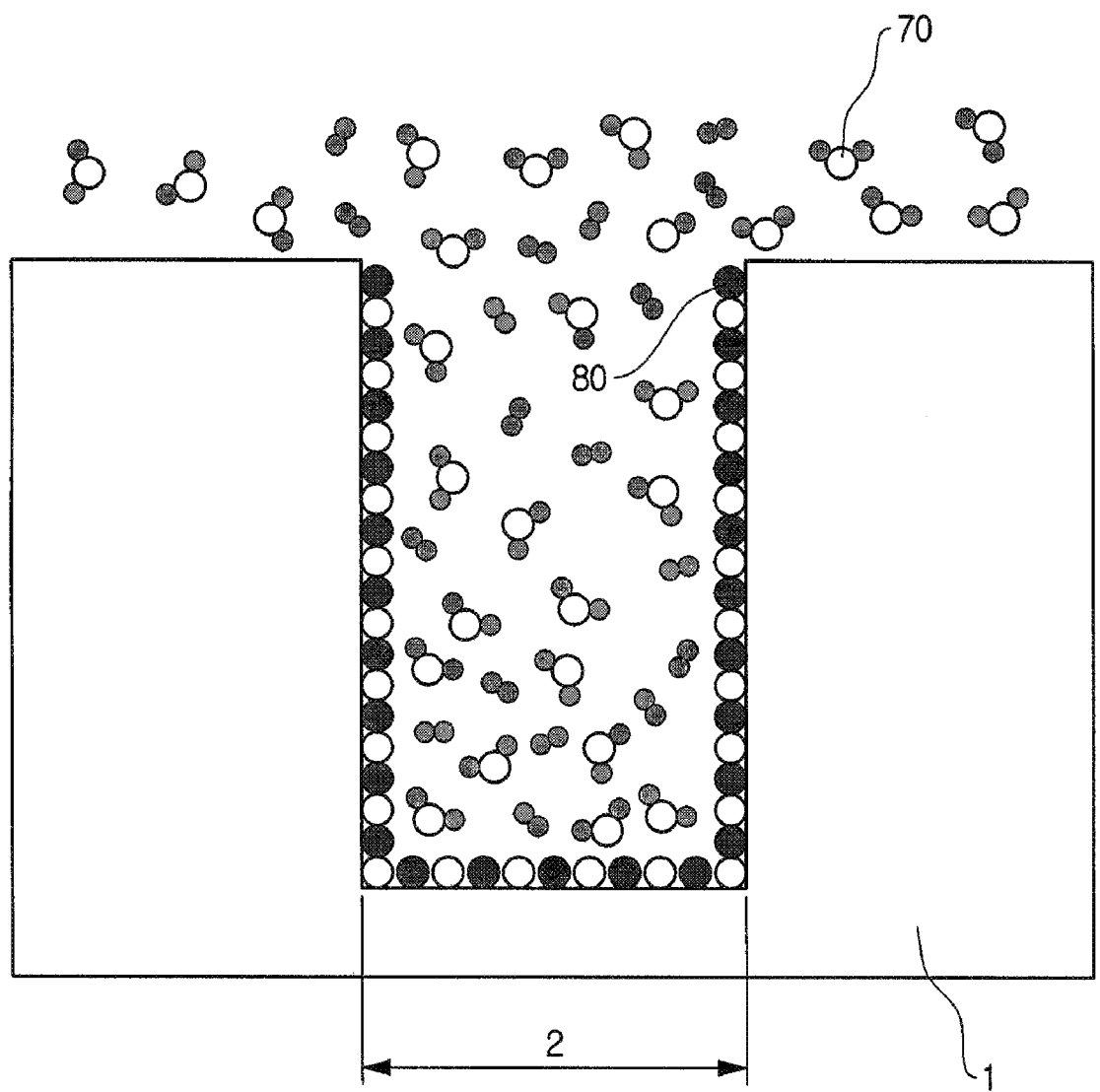
Figure 3G:
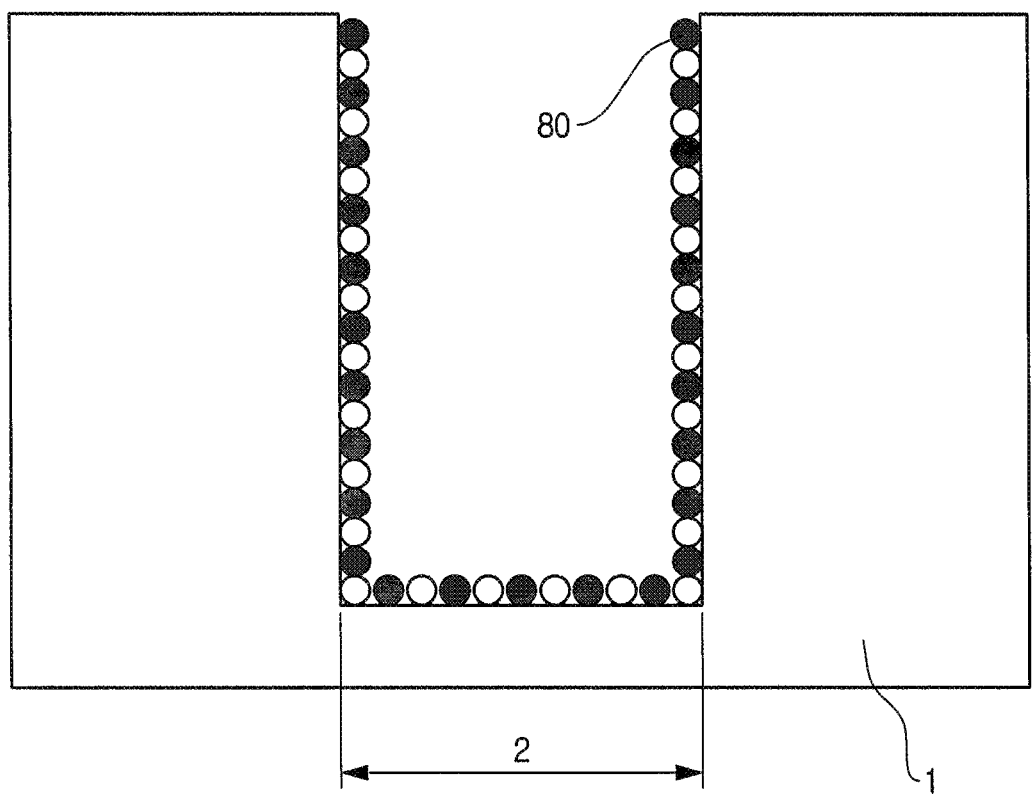

Referring to FIG. 3F and FIG. 3G, in one embodiment, the deposition film 50 formed on the portion of the substrate 1 other than the surfaces of the recess 2 reacts with a second material 70 to form a modified film 80. Referring to FIG. 3F, the substrate 1 with the deposition film 50 in the recess 2 may be exposed to the second material 70. The second material 70 reacts with the deposition film 50 to form the modified film 80 in the recess 2. That is, the second material 70 may be a reaction precursor for forming the modified film 80.

In one embodiment, the modified film 80 comprises an oxide or a nitride. For example, if the modified film 80 comprises an oxide, the second material 70 comprises at least one of $H_2O$, $H_2O$ plasma, $O_2$, $O_2$ plasma, $N_2O$, $N_2O$ plasma and $O_3$. If the modified film 80 comprises a nitride, the second material 70 comprises at least one of $NH_3$, $NH_3$ plasma, $N_2$ plasma and nitrogen radical. In this case, the modified film 80 may be formed of an oxide or a nitride, depending on the deposition film 50 and the second material 70. For instance, the modified film 80 may comprise at least one of $SiO_2$, SiN, $Al_2O_3$, AlN, $TiO_2$ and TiN.

Referring next to FIG. 3G, excess second material 70 is removed by purging gas, as described above. As a consequence, the modified film 80 comprising a nitrogen or oxygen compound may be formed in the recess 2 of the substrate 1. In FIG. 3G, the modified film 80 is illustrated as consisting of two different atoms. This is merely illustrative. The modified film 80 may consist of a single atom or more than three different atoms.

Figure 3H:
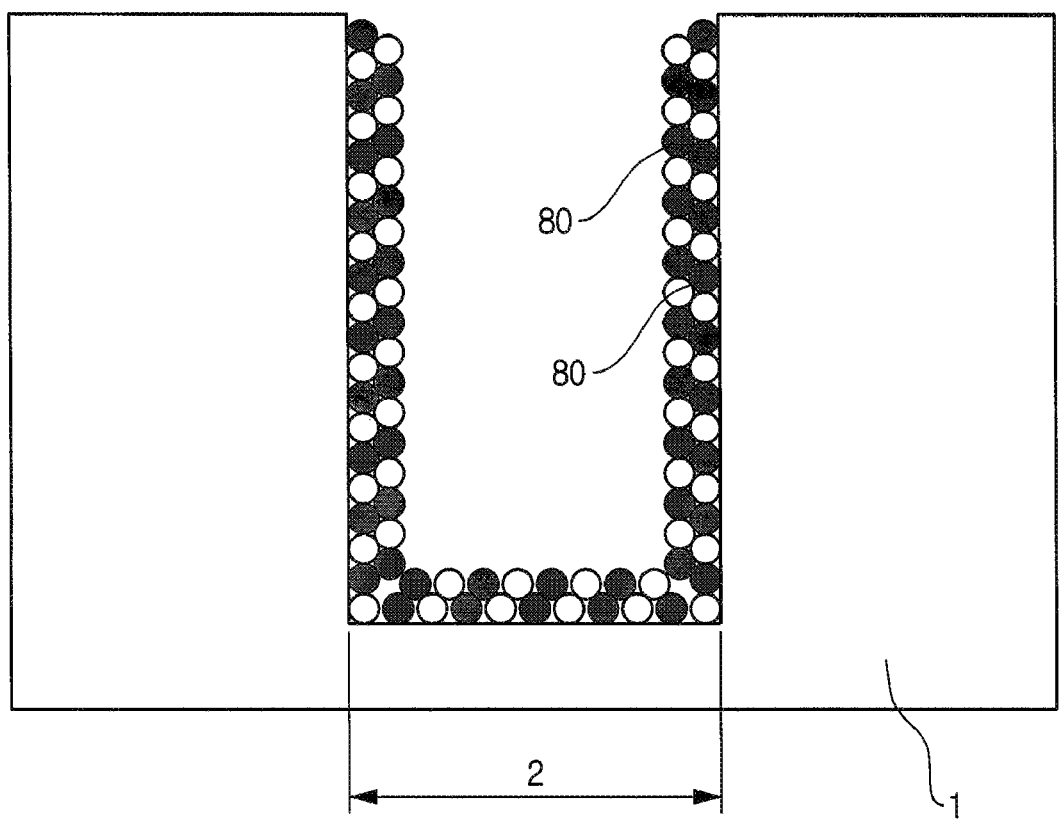
Figure 3I:
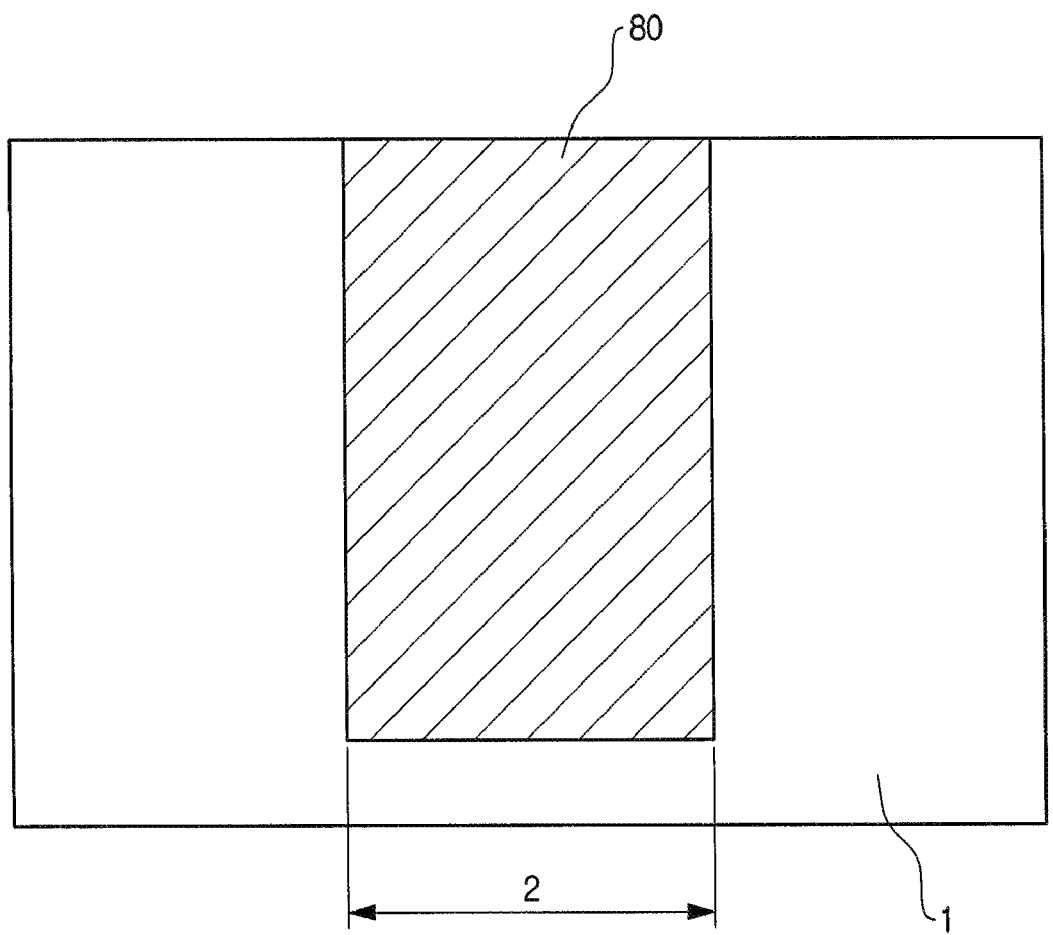

Referring to FIG. 3H, multiple layers of the modified film 80 are formed in the recess 2 of the substrate 1 by repeating the processes described with reference to FIG. 3B through FIG. 3G. The recess 2 of the substrate 1 may be completely filled with the modified film 80 by repeating the processes several times, as illustrated in FIG. 3I. Further, if the processes of modification by the second material is not performed, the recess 2 may be filled with the atomic layer type deposition film 50 in FIG. 3E.

Figure 4A:
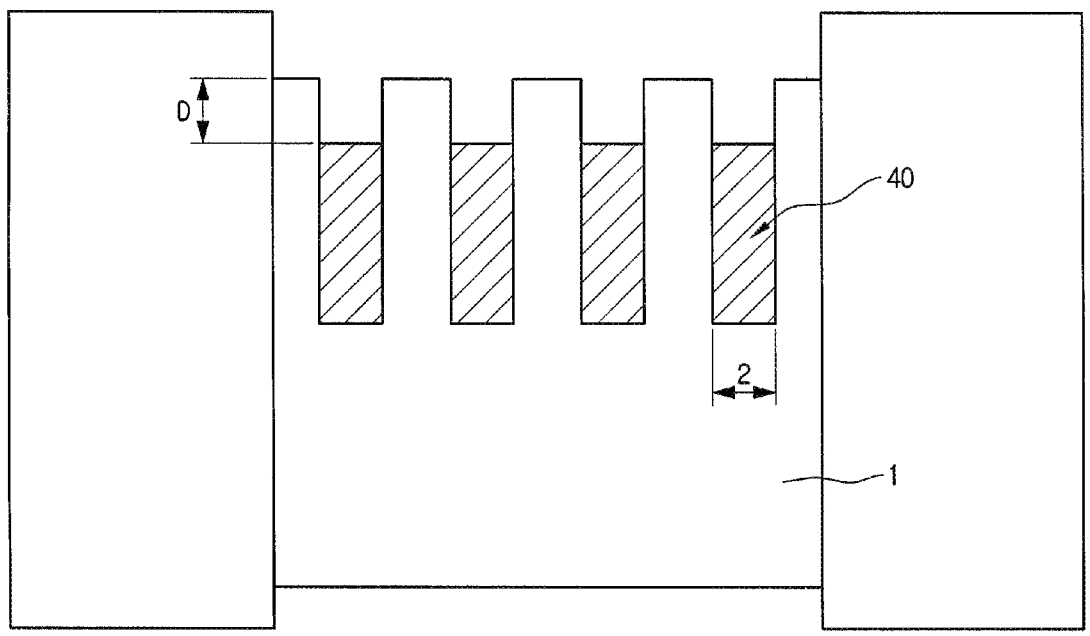
FIG. 4A and FIG. 4B are schematic diagrams illustrating a process of forming a substrate structure, according to still another embodiment.
Figure 4B:
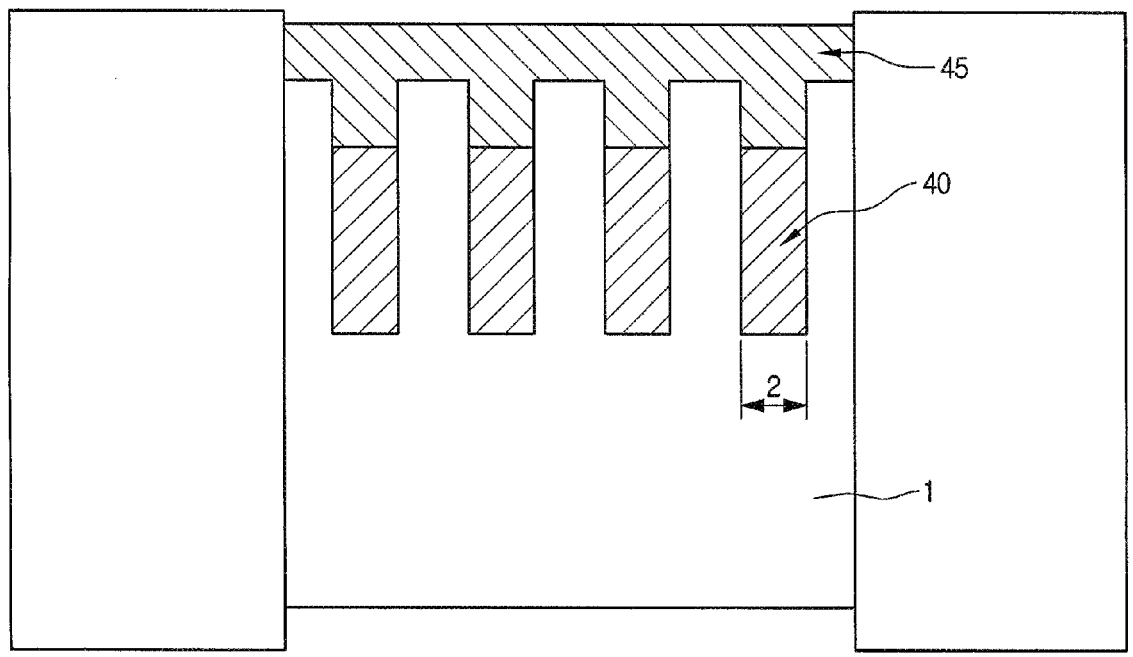

FIG. 4A and FIG. 4B are schematic diagrams illustrating the process of forming a substrate structure according to still another embodiment. Referring to FIG. 4A, a deposition film 40 is formed in recesses 2 of a substrate 1 according to processes of forming a substrate structure, as described above in detail with reference to FIG. 2A through FIG. 3I. By controlling the degree of diffusion of a reactive gas or other material into the recesses 2, or the reaction level in the recesses 2, the deposition film 40 is not formed over a predetermined depth D in the recesses 2, as illustrated in FIG. 4A. Accordingly, the recess 2 may is not filled completely with the deposition film 40.

Referring to FIG. 4B, an additional deposition film 45 may be formed over the entire surface of the substrate 1 having the partly-filled recesses 2. By depositing the deposition film 40 and the deposition film 45, each of which partly fill the recesses, the entire surface of the substrate 1 and the recess 2 may be filled completely, without any uneven covering.

Figure 5A:
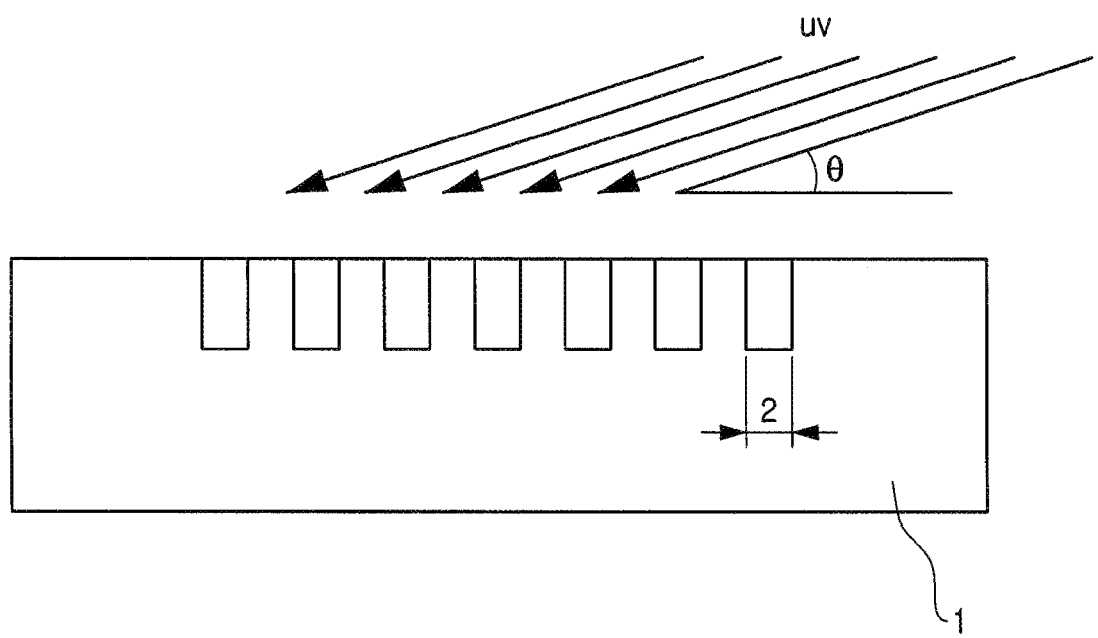
FIG. 5A through FIG. 5C are schematic diagrams illustrating the portion of a recess of a substrate in which a deposition film is formed depending on the incident angle of UV (Ultraviolet) light, according to an embodiment.
Figure 5B:
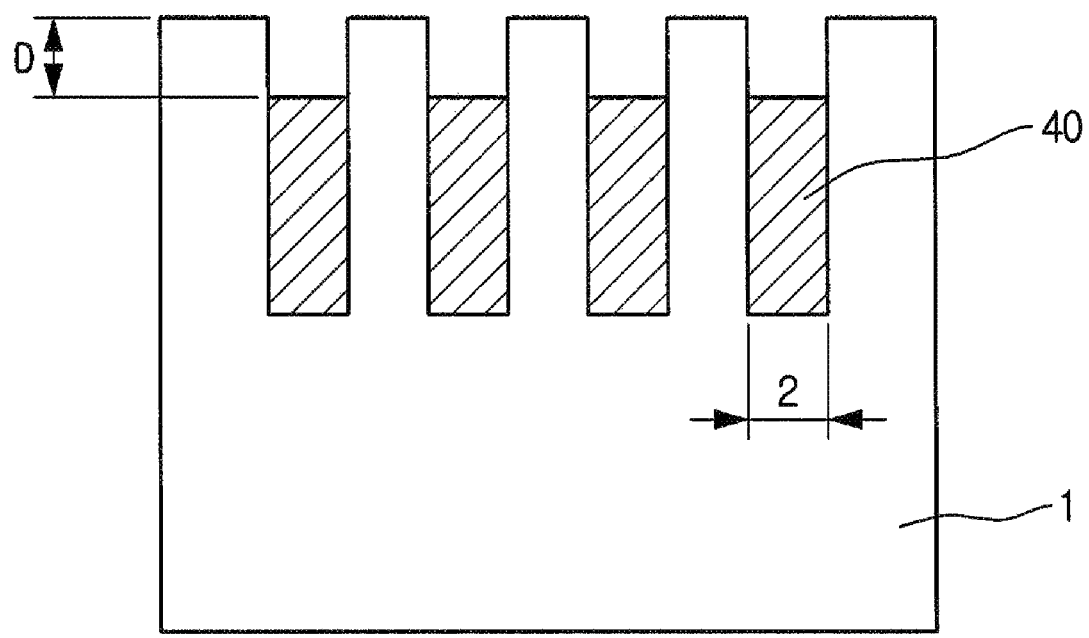
Figure 5C:
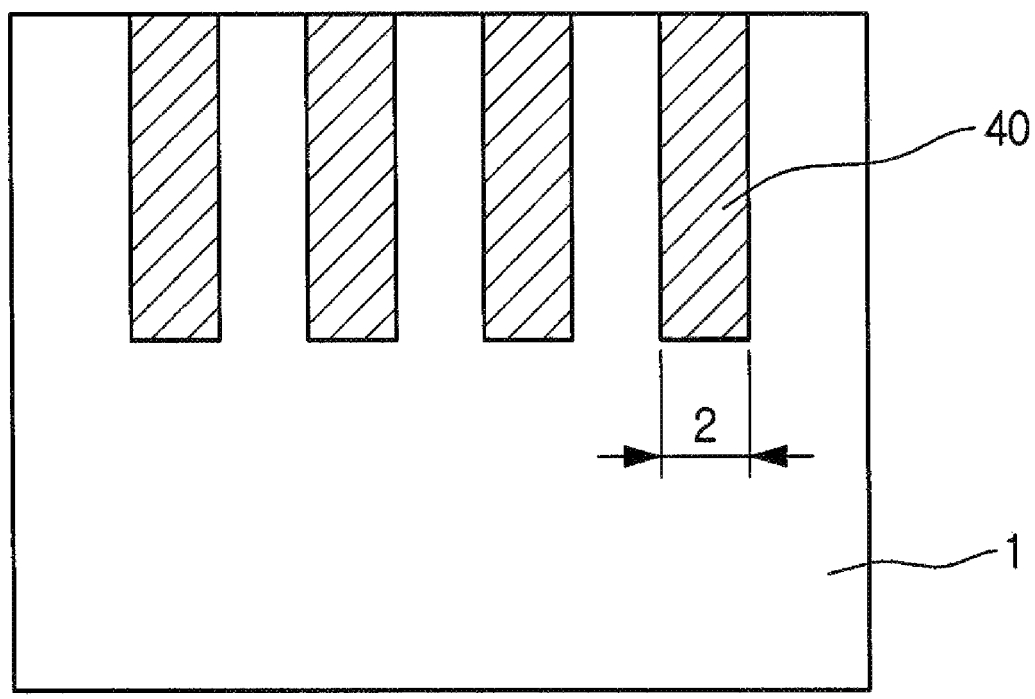

FIG. 5A through FIG. 5C are schematic diagrams illustrating portions of recesses of a substrate filled by exposing the substrate 1 and the recesses 2 to UV light, according to one embodiment. The recesses 2 may be partially filled by partly removing material from the portion of a substrate 1 other than the surfaces of the recesses 2 using, for example, a reactive gas. When a reactive gas activated by UV light is used, the incident angle of UV light to the substrate 1 may be controlled so that the material is selectively removed from the substrate 1 other than the surfaces of the recess 2. Referring to FIG. 5A, the UV light is incident with a predetermined incident angle θ to the substrate 1. If the incident angle θ of UV light is sufficiently large, UV light may reach the bottom of the recess 2. If the incident angle θ is smaller, however, UV light will reach only a portion of the recess 2.

Referring to FIG. 5B, if the incident angle θ is sufficiently small and UV light reaches a predetermined depth D of the recesses 2, the reactive gas may be activated in the recesses 2 above the depth D and the material deposited in the recess 22 may be removed. As a result, the recesses 2 are filled partly. Accordingly, referring to FIG. 5C, if the incident angle θ of UV light is sufficiently small, the reactive gas may not be activated inside the recesses 2, and the recesses 2 may be completely filled with a deposition film 40.

Figure 6:
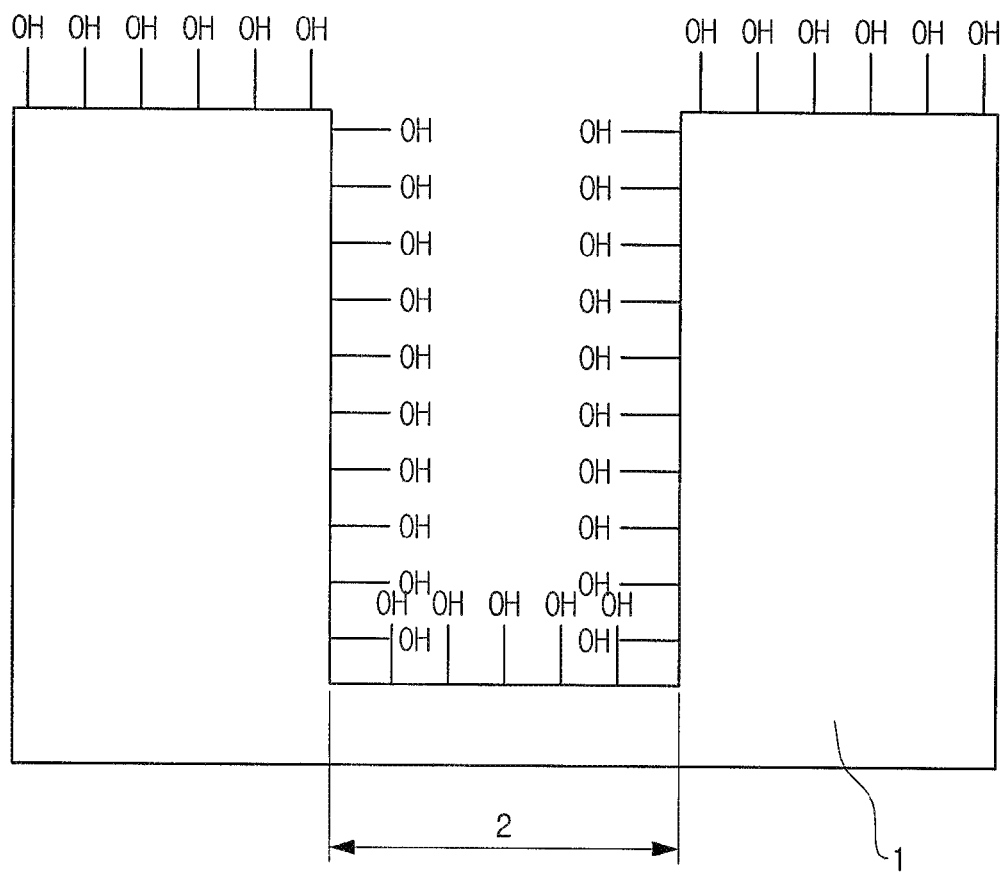
FIG. 6 is a schematic diagram illustrating the surface of a substrate OH-treated in a process of forming a substrate structure according to an embodiment.

FIG. 6 is a schematic view illustrating the surface of a substrate that is OH-treated, according to one embodiment. In this embodiment, the process of treating the surface of the substrate with OH bonds may be performed before performing the process of forming a substrate structure, as described above in detail with reference to FIG. 2A through FIG. 3I.

In order to form a substrate structure by atomic layer deposition, it may be advantageous to use a material that is effectively chemisorbed in the substrate as precursor. However, some materials used in CVD such as TEOS, do not have ligands or bonds required for selective chemisorption.

To ensure chemisorption of the precursor, the surface of the substrate 1 must be sufficiently terminated with OH. Accordingly, in one embodiment, a separate termination process must be performed on the surface of the substrate 1 before carrying out the process of forming the substrate structure, as described above in detail with reference to FIG. 2A through and FIG. 3I. Even when $H_2O$ is injected from a chamber, adsorption may not occur sufficiently because the surface of the substrate cleaned by HF solution may not be hydrogen-terminated. This may cause the so-called incubation phenomenon and may require a number of additional adsorption processes for adsorption of $H_2O$. Therefore, in this embodiment, the process of exposing the substrate to $H_2O$ plasma or remote plasma in order to produce hydroxyl radicals ((OH)*) may also be performed.

A direct application of $H_2O$ plasma to the substrate 1 may negatively affect the substrate 1 itself or a device mounted on the substrate 1. Accordingly, in one embodiment, plasma may be generated at a location away from the substrate 1 using $H_2O$ gas produced by forming Ar bubbles in deionized water (DI water). The substrate 1 may be exposed to the radicals produced by generating the plasma remote from the plasma.

In another embodiment, radicals produced by plasma may be injected into an $H_2O$ injector to produce hydroxyl radicals ((OH)*). Hydroxyl radicals ((OH)*) are provided to the substrate 1. Alternatively, an electrode may be installed perpendicular to the substrate 1. The plasma may then be generated in parallel to the substrate so that radicals may contact the substrate 1.

The substrate 1 treated by oxygen-supplying materials may have OH bonds, as illustrated in FIG. 6. That is, the substrate 1 may have a hydrophilic surface. Accordingly, when a material is provided on the OH-treated substrate, chemisorption may occur on the surface of the substrate 1 as the OH bonds are substituted by the material.

The above embodiments are described with reference to atomic layer deposition. This is, however, merely illustrative. In other embodiments, a deposition film may be formed in a recess of a substrate, for example, by chemical vapor deposition.

The substrate structure formed according to embodiments may be utilized to form materials such as oxide and nitride in the recess of a substrate. Further, the recess may be filled completely by repeating the processes. Accordingly, recesses in STI, contact holes, via holes of multiplayer wirings and through-silicon via (TSV) or the like with a large aspect ratio may be filled at low temperature.

Further, the process of forming a substrate structure according to embodiments may be utilized to form a semiconductor or metal material in the recess. Accordingly, a substrate structure may be used to fill the contact hole, via hole for multilayer wirings, or through-silicon via (TSV) for 3-dimensional packaging.

Further, it is possible to partially fill the recess because the depth at which the deposition film is formed in the recess may be adjusted by controlling the ejection speed or time of reactive gas, the transfer rate of the substrate or the like. Therefore, step coverage may be controlled as desired.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A method for forming a structure on a substrate formed with at least one recess, comprising:
    (a) depositing a layer of material on the substrate, the material deposited on surfaces within the at least one recess;
    (b) removing the deposited layer of material in first portions of the at least one recess shallower than a predetermined depth;
    (c) depositing another layer of material on the substrate and surfaces within the at least one recess;
    (d) removing the other layer of deposited material in the first portions of the at least one recess shallower than the predetermined; and
    (e) repeating (c) and (d) until second portions of the at least one recess at the predetermined depth and deeper than the predetermined depth are filled with the material.

2. The method of claim 1, wherein depositing the layer of material or depositing the other layer of the material comprises:
    exposing the substrate to a source precursor; and
    exposing the substrate exposed to the source precursor with a reactant precursor to deposit the layer of material by atomic layer deposition.

3. The method of claim 1, wherein the deposited layer of material is removed from the first portions by controlling diffusion depth of a reactive material for removing the deposited layer into the at least one recess.

4. The method of claim 3, wherein the diffusion depth of the reactive material is controlled by one or more of ejection speed of the reactive gas, ejection time of the reactive gas and moving rate of the substrate.

5. The method of claim 1, wherein the deposited layer of material is removed from the first portions by exposing the substrate deposited with the material to electromagnetic radiation directed at an angle relative to a top surface of the substrate.

6. The method of claim 5, wherein the electromagnetic radiation comprises at least one of microwave or ultraviolet light.

7. The method of claim 5, further comprising ejecting a reactant material onto the substrate, wherein the reactant material reacts with the deposited material and removes the deposited material when exposed to the electromagnetic radiation.

8. The method of claim 1, wherein the layer of deposited material comprises an atomic layer of silicon, aluminum or titanium.

9. The method of claim 1, wherein the at least one recess is part of a shallow trench isolation (STI) structure, contact holes or via holes.

10. The method of claim 1, further comprising forming OH bonds on the surfaces of the substrate before depositing the layer of material.

11. The method of claim 1, wherein the deposited layer of material comprises oxide or nitride.

12. The method of claim 5, further comprising repeating the depositing of the layer and the exposing the substrate to the electromagnetic radiation.

13. The method of claim 1, further comprising exposing the substrate to plasma generated at a location away from the substrate.

* * * * *